United States Patent [19]
Chick

[11] Patent Number: 5,485,118
[45] Date of Patent: Jan. 16, 1996

[54] NON-UNIFORMLY DISTRIBUTED POWER AMPLIFIER

[75] Inventor: Richard W. Chick, Carlisle, Mass.

[73] Assignee: Massachusetts Institute of Technology, Cambridge, Mass.

[21] Appl. No.: 253,809

[22] Filed: Jun. 3, 1994

[51] Int. Cl.⁶ .................................................. H03F 3/60
[52] U.S. Cl. .......................... 330/54; 330/277; 330/286; 330/295
[58] Field of Search .............................. 330/54, 277, 286, 330/295, 53, 56, 57

[56] References Cited

U.S. PATENT DOCUMENTS

| | | | |
|---|---|---|---|
| 3,210,682 | 10/1965 | Sosin | 330/54 |
| 3,593,174 | 7/1971 | White | 330/53 |
| 4,543,535 | 9/1985 | Ayasli | 330/54 X |
| 4,668,920 | 5/1987 | Jones | 330/286 |
| 4,733,195 | 3/1988 | Tserng et al. | 330/54 X |
| 4,752,746 | 6/1988 | Niclas | 330/277 |
| 4,772,858 | 9/1988 | Tsukii et al. | 330/277 |
| 4,853,649 | 8/1989 | Seino et al. | 330/54 X |
| 4,864,250 | 9/1989 | Bacon | 330/277 |
| 4,868,520 | 9/1989 | Terakawa et al. | 330/295 |
| 4,885,483 | 12/1989 | Aitchison | 307/492 |
| 4,973,918 | 11/1990 | Schindler | 330/277 |
| 4,992,752 | 2/1991 | Cioffi | 330/54 |
| 5,021,743 | 6/1991 | Chu et al. | 330/54 |
| 5,028,879 | 7/1991 | Kim | 330/54 |
| 5,081,706 | 1/1992 | Kim | 455/78 |
| 5,144,257 | 9/1992 | Karsten, Jr. et al. | 330/54 |
| 5,146,175 | 9/1992 | Green, Jr. | 330/54 |
| 5,166,640 | 11/1992 | Fathimulla et al. | 330/295 |
| 5,177,381 | 1/1993 | Friesen et al. | 307/492 |
| 5,196,805 | 3/1993 | Beckwith et al. | 330/54 |
| 5,208,547 | 5/1993 | Schindler | 330/54 |

FOREIGN PATENT DOCUMENTS

| | | |
|---|---|---|
| 590781 | 7/1947 | United Kingdom . |

OTHER PUBLICATIONS

Minnis B. J., "The Traveling Wave Matching Technique for Cascadable MMIC Amplifiers," *IEEE Transactions on Microwave Theory and Techniques*, 42(4):690–692 (1994, Apr.).

Houng, S. G., "2–D Distributed Amp Ups Power, Not Load," *Microwaves & RF*, pp. 139–140, 142 (1987, Apr.).

Wong, T. T. Y., *Fundamentals of Distributed Amplification*, (MA: Artech House), pp. 9, 185–189, and 256 (1993).

(List continued on next page.)

*Primary Examiner*—James B. Mullins
*Attorney, Agent, or Firm*—Hamilton, Brook, Smith & Reynolds

[57] ABSTRACT

An amplifier extracts the maximum power from a plurality of identical three-terminal electronic amplifying devices, herein coined "cells," by additively combining their power contributions. The amplifier, herein coined a "non-uniformly distributed power amplifier," is a distributed amplifying circuit in which the transmission line impedances between adjacent electronic amplifying devices varies throughout the distribution in a prescribed manner so as to optimize the power output and/or amplifying efficiency of the distribution. The distribution may be constructed in one, two, or three dimensions but will always produce an overall midband power gain which is equivalent to the sum of the gains of the devices contained in the distribution of an overall power output which is equal to the number of devices times the power contribution of a single contributing device. Regardless of the amplifier's dimensions, microwave input power will be disbursed throughout the amplifier by an array of transmission lines of varying characteristic impedance which interconnects the input terminals of nearest neighbor cells. A similar array of transmission lines having a mirror-image topology interconnect the outputs of nearest neighbor cells to produce an output port. The output end (or outbound edges of a rectangular distribution, or outbound surfaces of a three-dimensional array) of the input array terminated in a resistor to absorb incident signals. However the output transmission line array requires no resistive terminations other than the intended load which will be attached to the output port.

34 Claims, 18 Drawing Sheets

OTHER PUBLICATIONS

Sharangovich, S. N., "Broadband Power Amplifier with Distributed Gain Along Connecting Lines," *Pribory i Tekhnika 'Eksperimenta*, 2:375–377 (1984, Mar.–Apr.).

Ayasli, Y., et al., "2–20–GHz GaAs Traveling–Wave Power Amplifier," *IEEE Transactions on Microwave and Techniques*, 32(3):290–295 (1984, Mar.).

Gamand P., et al., "Potential Power Performances of the Distributed Amplifiers," pp. 395–397 (1984).

Moazzam, M. R., et al., "Novel High Power Distributed Amplifiers," *Conference: MILCOM 90*, pp. 0491–0495 (IEEE, N.Y., N.Y.: 1990).

Ayasli, Y., "An Overview of Monolithic GaAs MESFET Travelling–Wave Amplifiers," *Int. J. Electronics*, 58(4):531–541 (1985, Apr.).

Yoder, M. N., "Distributed, Monolithic Travelling–Wave Amplifiers," *Int. J. Electronics*, 58(4):543–551 (1985, Apr.).

Cole, J. B., et al., "Improved Design for Distributed Amplifiers," *Applied Microwave*, 1(3):56, 58, 60–2, 64–6 (1989, Nov.–Dec.).

Cole, J. B., et al., "Design Technique for High Power, High Efficiency, Broadband Distributed Amplifiers," *Conference: MTT–S International Microwave Symposium Digest*, pp. 941–944 (IEEE, N.Y., N.Y. 1989).

Collinson, A., et al., "Optimal Design of Monolithic Distributed Amplifiers for Power Operation," *20th European Microwave Conference 90, vol. 2*, pp. 937–942.

Espley D. C., et al. "The Pulse–Testing of Wide–Band Networks," J.I.E.E., pt. IIIa, pp. 141–145, 186–188, and 1176–1187, (1946).

NON-UNIFORMLY DISTRIBUTED POWER AMPLIFIER

GOVERNMENT FUNDING

This invention was made with Government support under Contract Number F19628-90-C-0002 awarded by the Department of the Air Force. The Government has certain rights in the invention.

BACKGROUND OF THE INVENTION

The principles of distributed amplification have been known since a British patent application by Percival was first published describing the concept in 1937. W. S. Percival, "Improvements In and Relating to Thermionic Valve Circuits," British Patent Specification No. 460,562, 1936. Ginzton, et al. later described the first practical implementation of the concept in 1948, using vacuum tubes as the active devices. See "Distributed Amplification", *Proc. I.R.E.*, V. 36, pp. 956–69, 1948. In essence, a distributed amplifier is an amplifier that produces an output by the successive gathering, along a uniform transmission line, of the contributions of multiple electronic amplifying devices.

Active electronic devices, those capable of amplification, contain spurious reactive elements, principally capacitance, associated with the physics of their operation and construction. A properly designed circuit employing these devices must contain appropriate compensation so that these reactances will have a minimal effect on the transfer of power within the desired operating frequency band. In conventional, not distributed, amplifying circuits this goal is achieved by resonating any residual reactance with a compensating reactance of the opposite sign, a procedure termed "conjugate matching." An amplifier designed on the basis of conjugate matching achieves the goal of optimum power transfer but with a substantial sacrifice in usable bandwidth.

A distributed amplifier design is realized by taking advantage of an alternative strategy for dealing with the spurious intrinsic device capacitances. When appropriately configured, a network containing both inductors and capacitors behaves as a short length of artificial transmission line over a very wide frequency band. Therefore, the input terminals of a plurality of electronic devices, containing extraneous intrinsic capacitance combined with appropriate compensating inductors, may be placed at regular intervals along an input transmission line while their output terminals are similarly placed along an output transmission line to achieve an aggregate network that retains very wideband performance.

In the original implementation and nearly all subsequent implementations the input and output transmission lines were designed to have a constant characteristic impedance throughout the network. Under this condition, the theoretical gain of the network becomes the sum of the gains of the individual contributing devices while the network bandwidth extends to the very high cutoff frequency beyond which the transmission line approximation of the spurious reactances no longer holds.

Although the conventional uniformly distributed amplifier is very attractive for applications requiring the highest gain-bandwidth product, it is not so well suited to applications requiring high output power. This is because the output power of a uniformly distributed amplifier is limited by the power handling capability of the final active device in the distribution. Each device contributes an equal output current onto the output transmission line. As these currents accumulate progressively in the direction of the load, the voltage must rise along the line in order that the ratio of the voltage-to-current, the characteristic impedance, may remain constant. This means that the voltage across each successive device in the cascade must inevitably be higher than its predecessor. Therefore, a uniformly distributed power amplifier must be designed such that the device nearest the load is operated within its rated voltage while all preceding devices remain suboptimally loaded. This limitation has been widely recognized for some time, K. B. Niclas, R. Pereira, and A. P. Chang, "On Power Distribution in Additive Amplifiers," *IEEE Trans. Microwave Theory Tech.*, Vol. MTT-38, November 1990, and a variety of strategies have been proposed for increasing the power output of distributed amplifiers while maintaining their wide operating bandwidth.

One general strategy is to introduce some form of direct passive power combining into the circuit. A power amplifier realized by combining the outputs of two simultaneously driven distributed tiers of cells on a single output transmission line of uniform characteristic impedance was demonstrated in 1984. Y. Ayasli, L. D. Reynolds, R. L. Mozzi, and L. K. Hanes, "2–20 GHz GaAs Traveling-Wave Power Amplifier", *IEEE Trans. Microwave Theory Tech.*, Vol. MTT-32, March 1984. While this approach does permit a factor-of-two power increase, it does not permit extracting the maximum power available from the cell combination. Also this technique is not extendible beyond two tiers.

Distributed power amplifiers have also been constructed with the active devices coupled to the input line through discrete series capacitors. B. Kim, and H. Q. Tserng, "0.5 W 2–21 GHz Monolithic GaAs Distributed Amplifier," Electronics Letters, 20, 288–289; and Y. Ayasli, S. W. Miller, and R. L. Mozzi, and L. K. Hanes, "Capacitively Coupled Traveling-Wave Power Amplifier," *I.E.E.E. Transactions on Microwave Theory and Techniques*, Vol. 32, 1704–1709. The series capacitors act with the intrinsic cell capacitance as a voltage divider to produce an impedance transformation that can be useful under certain circumstances. This approach, however, does not directly address the primary power constraint—the limitations in aggregate device power output.

Still a third approach to increasing power output is to increase the number of contributing cells by forming a higher order array. A two-dimensional array of device cells intended for power amplification was described in 1987 in which cascade connected one-dimensional input and output lines are intermeshed. See S. G. Houng, "2-D Distributed Amp Ups Power, Not Load," *Microwaves & RF,* April, 1987. Again, transmission lines having a uniform characteristic impedance along their length were proposed, resulting in a suboptimal power utilization of the plurality of device cells.

The possibility of changing the characteristic impedance of the output transmission line in order to increase the power output of a distributed amplifier has been recognized by others. A. G. Hughes and K. Wilson, "A novel approach to the design of a monolithic distributed power amplifier", IEE Colloquium on 'Solid State Microwave Power Generation' (Digest No.88) p.6/1–5, 30 May 1986. The fundamental impedance conditions for optimum power output were not recognized which is evident from the use of a dummy load on the output line to compensate for reverse traveling waves.

SUMMARY OF THE INVENTION

In summary, the present invention is a microwave distributed amplifier that provides the maximum power output available from a plurality of active device cells over a very wide frequency bandwidth. Each stage of such an amplifier is composed of a distributed array of identical cells. These cells are combined so that each cell in the array operates within the same voltage and current values while the total output power is equal to the number of cells times the maximum available power contribution of an individual cell. Realization of high gain power amplifiers is accomplished by cascading distributed arrays with appropriately chosen power output capabilities. The present invention, therefore, permits a high degree of independent control of the gain and power characteristics of an amplifier design containing a single constituent device cell throughout.

To achieve the maximum power contribution from each cell in a single distributed stage, the cell outputs are sequentially connected to a transmission line network that comprises line segments having a prescribed characteristic impedance, which in general changes from segment-to-segment, and is therefore non-uniformly distributed among the cells.

The input transmission line network for the inventive distributed power amplifiers is also non-uniform. Since the fundamental amplifying mechanism for most active devices is a voltage-controlled current source, the device cells do not absorb power other than that which is dissipated in spurious losses. Therefore optimum overall performance is obtained when the maximum voltage is presented to each of the device cells over the desired frequency bandwidth. This is accomplished by considering the input network as a lossy synthetic transmission line that must ultimately be terminated in a load. An input network associated with a single tier distributed power amplifier is terminated in a single resistor, the value of which is chosen by selecting the overall cutoff frequency of the network. In input networks for two-dimensional arrays, terminating resistors to ground must be connected to every node located on an outbound edge of the input network. In three-dimensional distributions, terminating resistors must be connected to every node located on an outbound surface of the input network.

It is a hallmark of the present invention that all the cells within a given amplifier stage, regardless of configuration, must be directly connected to one another such that a single DC connection to any point on the output line will provide bias to all the output terminals while a single DC connection to any point on the input line will bias all the input terminals.

In general, in one aspect, the invention concerns a distributed power amplifier, that comprises an input line, an output line, and a plurality of active devices. These devices are connected between and along the input line and the output line. The output line presents load impedances to the active devices such that each device has a load impedance substantially equal to a corresponding optimum load impedance.

In preferred embodiments, the active devices are arranged in a two-dimensional array.

In general, in another aspect, the invention features a distributed power amplifier that comprises an input line, an output line, and a plurality of active devices. These devices are connected between and along the input line and the output line. Impedances are distributed along the input line so that substantially the same voltage is presented to each one of the active devices.

In preferred embodiments, each one of the active devices amplifies the corresponding presented voltage by substantially the same amount.

In general, in another aspect, the invention features a distributed power amplifier that comprises an input line, an output line, and an array of active devices, connected between and along the input line and the output line. Associated input line impedances are distributed between input terminals of the active devices and vary with respect to each other as the inverse of a position of the associated active devices.

In preferred embodiments, substantially the same voltage is presented to each input terminal of each one of the active devices. In other embodiments, the active devices amplify voltages presented at the input terminal by the same amount.

In general, in a different aspect, the invention features a distributed power amplifier that comprises an input line, an output line, and an array of active devices, connected between and along the input line and the output line. The active devices amplify a voltage on the input line by substantially the same mount and make substantially the same power contribution to the output line.

In general, in still another aspect, the invention features a distributed amplifier, that comprising a two-dimensional input line, a two-dimensional output line, and a two-dimensional array of active devices connected between the input line and the output line.

In preferred embodiments, the two-dimensional input line connects input terminals of adjacent active devices. In still other embodiments, the two-dimensional input line directly connects input terminals of active devices that are adjacent to each other along rows and columns of the array of the active devices. In other preferred embodiments, the two-dimensional input line comprises compensating impedance elements between the adjacent active devices. In still other preferred embodiments, impedances of each one of the compensating impedance elements is selected so that substantially the same voltage is presented to each input terminal of each one of the active devices. In yet other preferred embodiments, the active devices amplify voltages presented at respective terminals by substantially the same amount.

In general, in yet another aspect, the invention features a distributed power amplifier that comprises an input line in the form of a grid, an output line in the form of grid, overlapping the input line, and a plurality of active devices connected between the input line and the output line.

In preferred embodiments, the active devices are connected to grid line intersections of the input line. In other preferred embodiments, the output terminals are connected to grid line intersections of the output line.

The above and other features of the invention including various novel details of construction and combinations of parts will now be more particularly described in reference to the accompanying drawings and pointed out in the claims. It will be understood that the particular distributed power amplifier embodying the invention is shown by way of illustration and not as a limitation of the invention. The principles and features of this invention may be employed and varied in numerous embodiments without departing from the scope of the invention.

BRIEF DESCRIPTION OF THE DRAWINGS

Additional objects and features of the present invention will be more readily apparent from the following detailed description and appended claims when taken in conjunction with the drawings, in which:

FIG. 2a shows a network composed of four identical transmission lines of characteristic impedance $Z_O=R_{OPT}$ where $R_{OPT}$ is the optimum load resistance for an individual cell. FIG. 2b shows the circuit of FIG. 2a with the individual input ports displaced by arbitrary lengths of transmission line as would be necessary to compensate for the associated input circuit delays. FIG. 2c shows the adjacent transmission line segments recombined to form a non-uniform transmission line structure terminated in a single load $R_L=R_{OPT}/4$, that is the electrical equivalent for properly phased sources of FIG. 2b;

DETAILED DESCRIPTION OF THE EMBODIMENTS

First Embodiment

Figure 1:
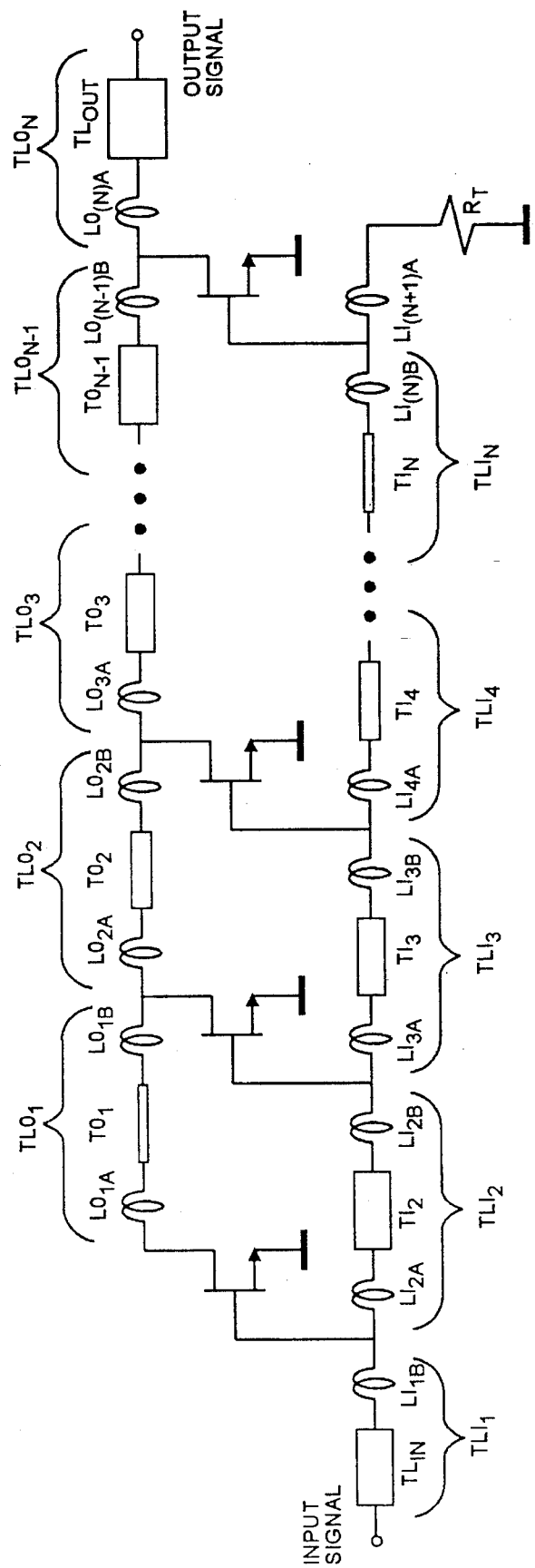
FIG. 1 is a block diagram of 1×N distributed power amplifier of the invention showing transmission line segments of differing line impedance between adjacent device cells.

FIG. 1 depicts a non-uniformly distributed power amplifier constructed according to the principle of the present invention. The amplifier comprises a single tier of N identical active devices labeled $Q_x$ where "x" identifies the placement of the element along the distribution. The active devices are field effect (FET) transistors.

The elements labeled $TLO_x$ are output transmission line segments and those labeled $TLI_x$ are input line segments. The transmission line labeled $TL_{OUT}$ provides a broadband connection to the output port where a load is attached. The line labeled $TL_{IN}$ provides a similar broadband connection to the amplifier's input port. These lines may be replaced by impedance matching networks or transmission lines if desired for a particular application. The resistor $R_T$ provides a broadband termination for the input line to absorb signals that would otherwise be reflected back into the amplifier and diminish its useful bandwidth.

Bias is presented to all the FETs $Q_1$ to $Q_n$ in the cascade through high-impedance RF blocking elements, which are not shown in FIG. 1 but may be connected at any point along the input and output lines. In addition, gate bias may be injected through $R_T$ if the termination is DC-isolated from ground by a blocking capacitor.

The input signal is delivered to the amplifier through the input line $TL_{IN}$ and presented to the gate of each of the FET's $Q_1$ to $Q_n$ in succession through the non-uniform input distribution line. The transmission line segments $TLI_1$-$TLI_N$ are chosen such that the voltage presented to each FET, or active device cell, is the same. That power, which is not absorbed by the incidental device losses, is delivered to the input line termination $R_T$.

The signal voltage appearing at the gate terminals of the FET's $Q_1$ to $Q_N$ is amplified to the same degree by each of the FET's because of the selection of output line segments $TLO_1$-$TLO_N$ and because the FET's are identical. The amplified voltage is then presented to a node located along the non-uniform output transmission line. The delay between nodes along the output line is matched to the delay between nodes along the input line. Therefore, the output contribution of each FET is exactly the same in magnitude and has been adjusted to arrive in exactly the same phase along the output line. The effect is as though an ever increasing number of cells appear directly in parallel as one approaches the amplifier's output port. Therefore, the impedances $TLO_1$-$TLO_N$ of the output transmission line structure must be incrementally changed to reflect these altered load conditions.

Figure 2A:
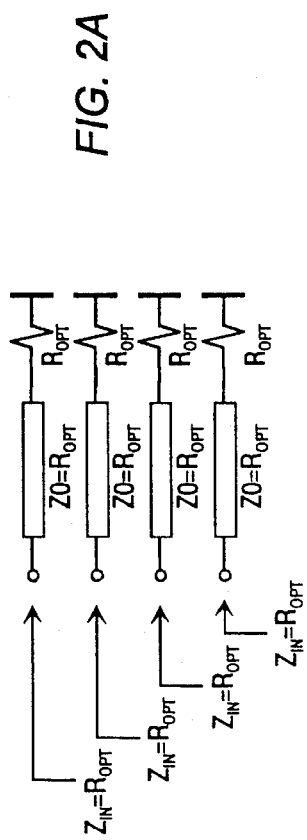
FIG. 2a through 2c illustrates the development of the inventive non-uniform output transmission line suitable for a 1×4 distributed power amplifier.
Figure 2B:
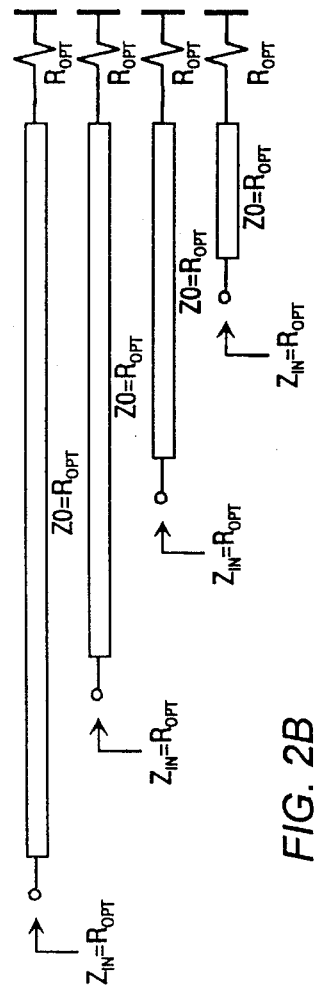
Figure 2C:
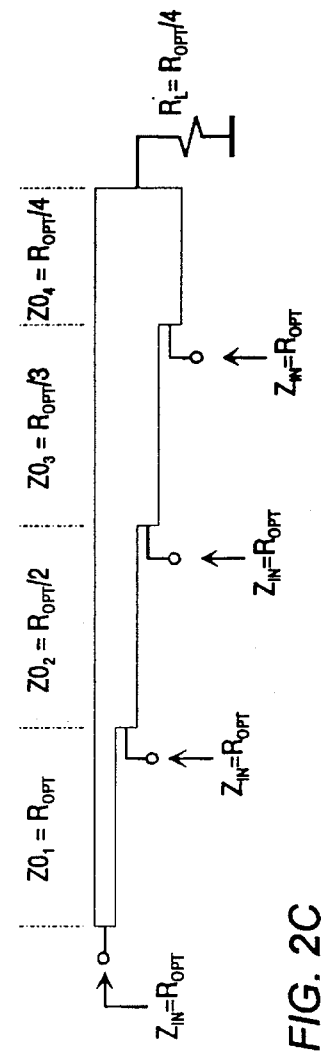

FIGS. 2a through 2c show the development of a typical output transmission line structure for a four-cell amplifier. Optimal power output for a group of devices may only be achieved when each device sees its optimal load impedance $R_{OPT}$. In an amplifier containing a plurality of identical contributing device cells, this may only be obtained when the maximum current and voltage excursions for each of the constituent cells is the same and equal to the single-cell optimum. As an example, the problem of a four cell device can be analyzed by considering each device feeding its own load, FIG. 2a, in which the load resistance of each device is the optimum resistance $R_{OPT}$. The equivalent load resistance of the four cell device is simply the parallel combination of the optimum resistance, $R_L = R_{OPT} \div 4$. When the individual transmission lines are lengthen to compensate for transmission delays in the input circuit, the impedances presented to each device must still remain $R_{OPT}$, FIG. 2b. Since the phase and amplitude of the voltage is identical for each of the lines, the lines may be recombined into a single line feeding a single load. The process of recombining results in a single transmission line comprised of line segments in which a characteristic impedance of the line segments connected between the output terminal of cell "i" and cell "i+1" is defined by $Z0_i = R_{OPT} \div i$, FIG. 2c. Therefore, in this first embodiment, the non-uniformly distributed power amplifier is an amplifier designed to permit the maximum transfer of power from an arbitrary number of FET cells that have been embedded in an electrical network providing the broadband frequency response characteristics of a distributed amplifier. In the situation where $R_L$ does not equal the arbitrary load impedance of an actual load, a transformer can be used to match the desired load impedance, $R_L$, to the arbitrary actual load.

The analysis concerning the selection of the characteristic impedance of the input line is essentially the inverse situation of the output line. Here, the overriding criteria is that every device must see or be driven by the same voltage. The easiest method to achieve this is to vary the characteristic impedances of each interconnecting line segment with respect to each other as $1/i$. This configuration would maximize gain at the expense of bandwidth. Bandwidth can be increased by artificially lowering the line impedances and the adding the resistive load $R_T$.

Figure 12:
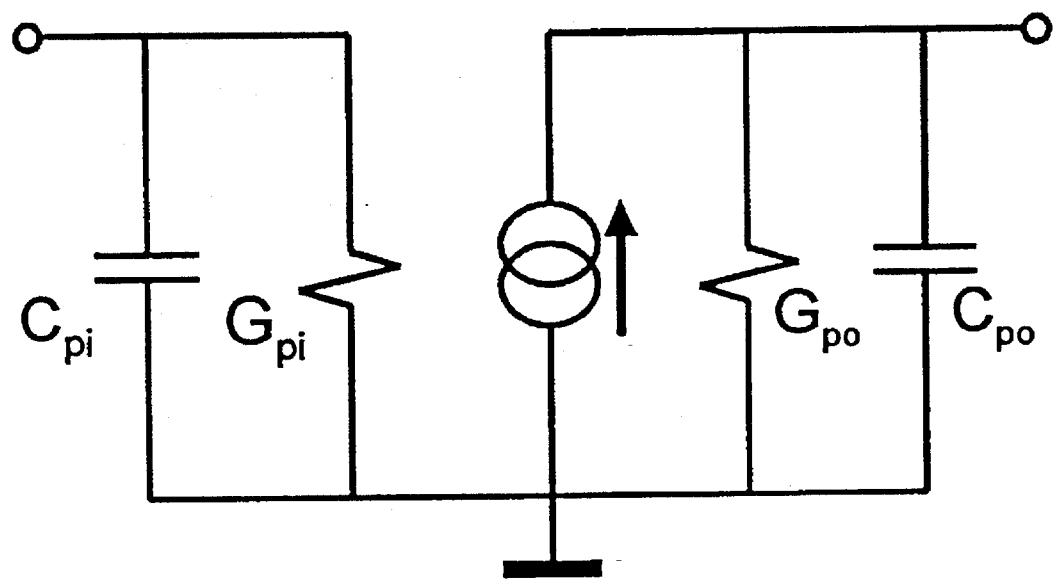
FIG. 12 shows a simplified active device equivalent circuit.

The specific inductances L and transmission lines T of FIG. 1 making up the input and output transmission line segments $TLI$, $TLO$ are selected according to the following procedure. A simplified device equivalent circuit is shown in FIG. 12 for the purposes of this design procedure. The input and output equivalent circuits are represented by a shunt RC network. The parallel capacitance is thus compensated with a series inductance such that the resulting L-network approximates the desired line characteristic impedance over a broad bandwidth. The characteristic impedance of the L-network is given by, $$Z0 = \sqrt{\frac{L}{C}}.$$

Therefore the inductance as a function of the required characteristic impedance may be obtained from $$L = Z0^2 \times C.$$

As the operating frequency begins to approach the cutoff frequency defined by, $$f_c = \frac{1}{\pi \sqrt{LC}},$$

the reflection coefficient rises markedly. Since the capacitance usually cannot be reduced because it is determined by the active devices, it is necessary to lower the operating impedance in order to reduce the LC product and raise the cutoff frequency if that is desired. This tradeoff is usually only necessary in the input network since the input capacitance of the FET active devices is typically 10 to 100 times output capacitance.

Figure 14:
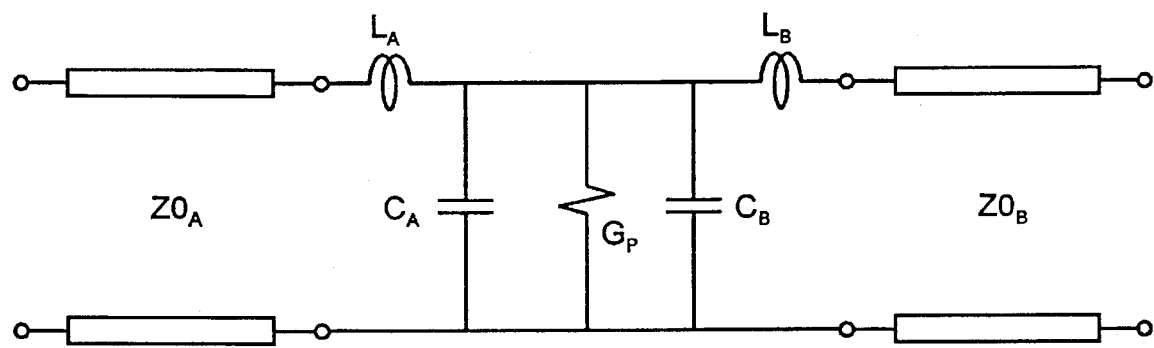
FIG. 14 shows a device at the junction of two transmission lines.

In the non-uniformly distributed power amplifier of FIG. 1, each active device is located at a junction of two transmission lines of differing characteristic impedance as shown in FIG. 14, the equivalent capacitance may be apportioned to inductors associated with the connecting lines so as to maximize the overall cutoff frequency. The maximum will of course occur when $fC_a = fC_b$. Under this condition $$L_a C_a = L_b C_b$$

therefore $$C_a^2 \times Z0_a^2 = C_b^2 \times Z0_b^2,$$

from which $$C_a = \frac{Z0_b}{Z0_a} \times C_b.$$

Since $C = C_a + C_b$, $$C_a = \frac{C}{1 + \frac{Z0_a}{Z0_b}}, \text{ and } C_b = \frac{C}{1 + \frac{Z0_b}{Z0_a}}.$$

Therefore $$L_a = \frac{Z0_a^2 \times C}{1 + \frac{Z0_a}{Z0_b}}, \text{ and } L_b = \frac{Z0_b^2 \times C}{1 + \frac{Z0_b}{Z0_a}}.$$

If for example the impedances $Z0_a$ and $Z0_b$ are equal, the capacitances $C_a$ and $C_b$ would likewise be equal and equal to ½ of the total device capacitance. Under such circumstances the inductances $L_a$ and $L_b$ would also be halved in order to maintain the same characteristic impedance. The cutoff frequency of the resultant L-sections would be doubled as compared to a single L-section at the same impedance level.

To summarize the method of impedance selection with regard to FIG. 1, the characteristic impedances of input line segments $TLI_1$ through $TLI_n$ are selected so that the same voltage is presented to the gates of each transistor $Q_1$ through $Q_n$. The characteristic impedance of the input line segment $TLI_3$, for example, is a function of the inductances $L_{13a}$ and $L_{13b}$ and the transmission line $T_{13}$. The bandwidth of the amplifier is determined by the cutoff frequency of the input line segments. The inductances and the transmission lines are chosen to maximize the cutoff while compensating for capacitances of the devices. The resistance $R_T$ is used to terminate line segments and prevent reflections.

On the output line, the characteristic impedances of output line segments $TLO_1$ through $TLO_n$ are solely a function of the optimal load resistances $R_{OPT}$ of the devices $Q_i$ divided by the position of the segment, i. The inductances $L_{Oia}$ and $L_{Oib}$ are chosen to compensate for the capacitances of the active devices. For example, the capacitance of transistor $Q_3$ is compensated by $L_{O2b}$ and $L_{O3a}$, the total required compensating inductance is apportioned as described in connection FIG. 14. Output transmission line segments $T_{O1}$ through $TO_n$ are chosen so that the delay along the output line matches the delay along the input line while meeting the required characteristic impedance.

Second Embodiment

Figure 3A:
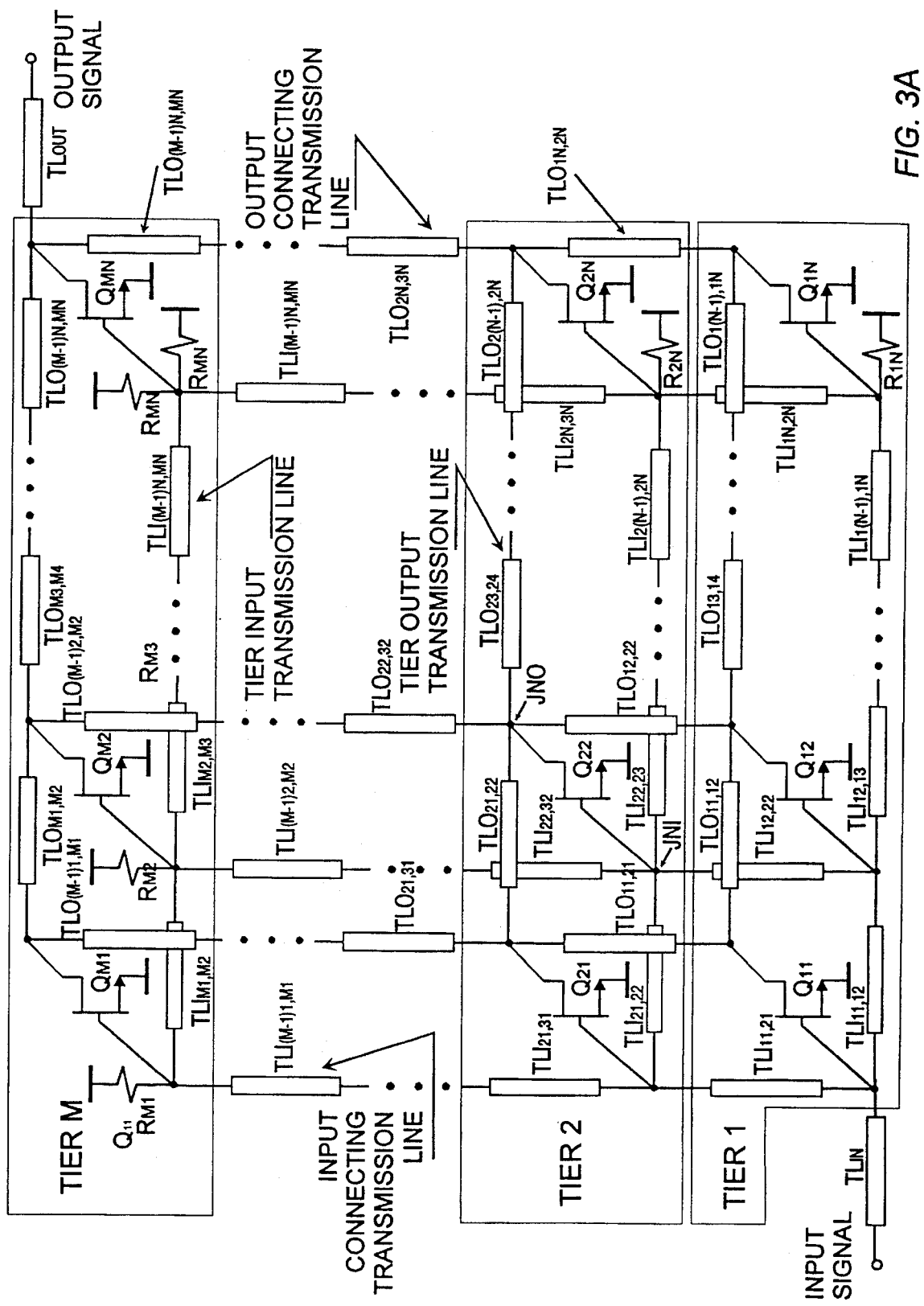
FIG. 3a is a block diagram of an inventive two-dimensional distributed power device array configured with a transmission line segment between every vertically and horizontally adjacent cell.

A second embodiment of the principles of the present invention is shown in FIG. 3a. In this case a number of tiers of cells have been added to produce a two-dimensional cell array, although this approach could be extended to yield a multi-dimensional array beyond two dimensions. Generally, the two-dimensional array comprises a planar grid-like input line made up of input or network transmission line segments $TLI_{x,y}$. These input line segments are arrayed in the form of a two dimensional grid to yield the input line or network. The gate terminals of each of the FET's $Q_{x,y}$ are connected to the gates of their neighbors along the axes of the input line grid by the input transmission line segments $TLI_{x,y}$.

A planar grid-like output line or network overlays the input line. Output line segments $TLO_{x,y}$ make up the output line and interconnect the drain terminals of neighboring FET's along the axes of the output line grid. These output line segments are also arrayed in the form of a two dimensional grid.

Input power is presented to the gate of FET $Q_{11}$ which is located in one corner of the cell array. Power then propagates in the two-dimensions of the input line essentially diagonally throughout the array presenting the same voltage to the gates of each FET $Q_{x,y}$ in the same manner as for the single-tier amplifier of the first embodiment. When the residue of the traveling input wave reaches the outbound edges of the input distribution network, it is dissipated in the terminating resistors $R_{m,x}$ and $R_{y,n}$. More specifically, power propagates into each grid line intersection or node of the input line along the two-dimensions of the grid. Then, the power that is not absorbed into the FET gate is divided in two dimensions. For example, intersection or node JNI receives power via input transmission line segments $TLI_{32,22}$ and $TLI_{23,33}$. The power that is not absorbed into the gate of transistor $Q_{33}$ is then divided between transmission line segments $TLI_{33,43}$ and $TLI_{33,34}$.

Meanwhile the output power contributions of the individual FET's are collected by the output line in a traveling wave that propagates toward the far corner of the array, which is diagonally opposite from the input port. As in the input line, power in the output line is similarly merged and divided in the two dimensions of the output line. For example, power is received into node JNO via output transmission line segments $TLO_{32,33}$ and $TLO_{23,33}$. This merged power in combination with the power contribution of transistor $Q_{33}$ is then divided between output transmission line segments $TLO_{33,43}$ and $TLO_{33,34}$. The impedances of the output transmission line segments $TLO_{x,y}$ are adjusted to produce identical loading conditions for all FET cells throughout the array also as in the first embodiment. It is significant to note that for both the input and output lines the splitting of propagating waves always takes place in binary fashion. This makes it convenient to divide paths where the current distribution normal to the plane of propagation is not uniform (e.g. the current density in microstrip increases toward the edges of the strip).

Figure 4:
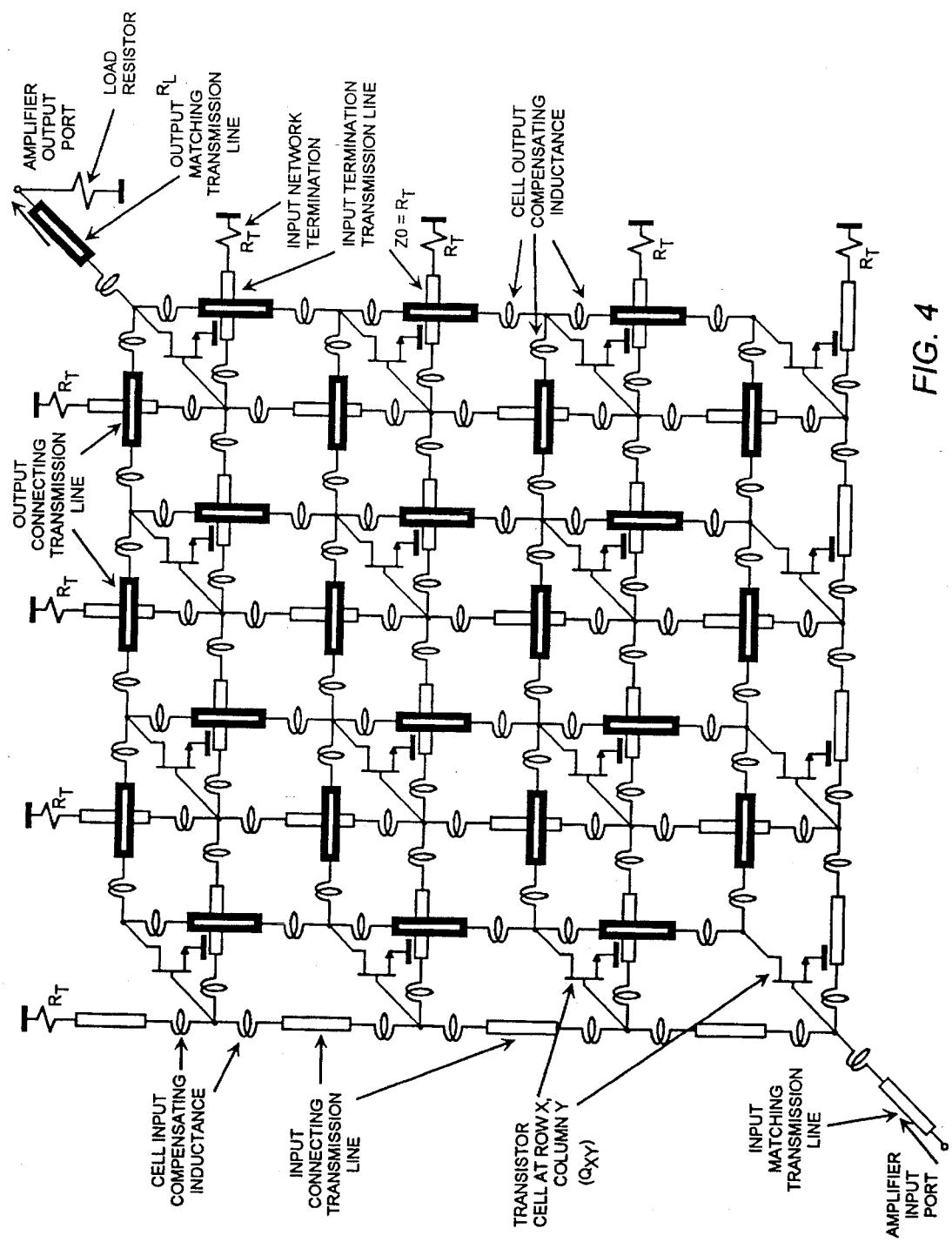
FIG. 4 shows the inventive non-uniformly distributed power amplifier having four rows and four columns of device cells using the topological configuration of FIG. 3. Inductances have been added to each circuit node as necessary to provide compensation for the equivalent intrinsic FET capacitances.

As with all distributed amplifiers, the intrinsic device reactances are compensated throughout the network so as to form synthetic transmission line segments that may be absorbed into the desired non-uniform distribution. The intrinsic reactances of most devices, including FET's, is a shunt capacitance. Consequently, series inductances, cell input compensating inductances and cell output compensating inductances, are added to the transmission lines at each of the nodes to form short synthetic transmission line segments having the same characteristic impedance as the desired line. The compensation is equally shared among all the intersecting lines. Therefore, in the two dimensional array there are always between two and four line compensations at the gate and drain terminal of every device cell. A specific example of a 4×4-cell square array with full reactance compensation is shown in FIG. 4. The input connecting transmission lines and output connecting transmission lines are selected so that propagation delays between the input line and output line are matched.

A principle advantage of the second embodiment of FIG. 3a is the flexibility it offers in addressing a fundamental design limitation of all power amplifiers. As the aggregate number of parallel devices grows in any power amplifier, the optimal load impedance diminishes to unacceptably low values. In the single-tier realization of the non-uniformly distributed power amplifier of the first embodiment the required load impedance may be restored to a higher value by removing cells from the string. The amount of the increase will be in direct proportion to the percentage of cells removed. In the two-dimensional distributed array an additional factor is at work that helps to alleviate the load impedance problem. Removal of devices in a square array results in a larger number of output nodes (k) which may deliver power to the load. The load impedance, $R_{LOAD}$, required by each of these outputs is approximately equal to $R_{LOAD} \approx R_{OPT}/k$. When the load is a succeeding distributed power amplifier stage, that stage may be designed to present the proper number of input ports. If the output is to feed an external load, passive power combining methods may be used that take advantage of the multiplicity of identically driven higher impedance ports that are available.

Figure 5B:
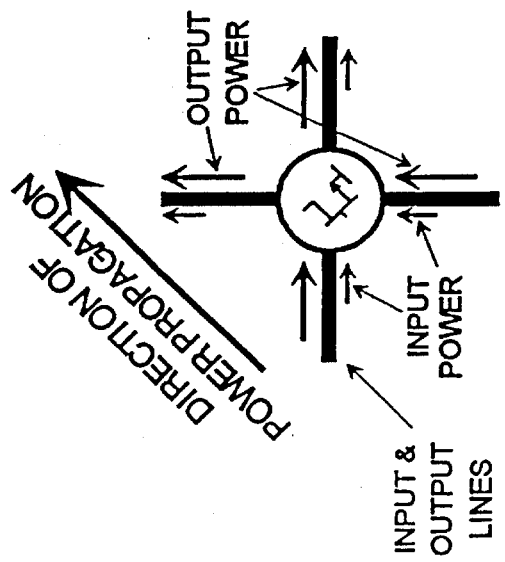
FIG. 5b shows a graphic token that is the functional equivalent of FIG. 5a. Input and output lines are combined in a single symbol in FIG. 5b in order to facilitate the illustration of arrays containing larger numbers of cells.
Figure 5A:
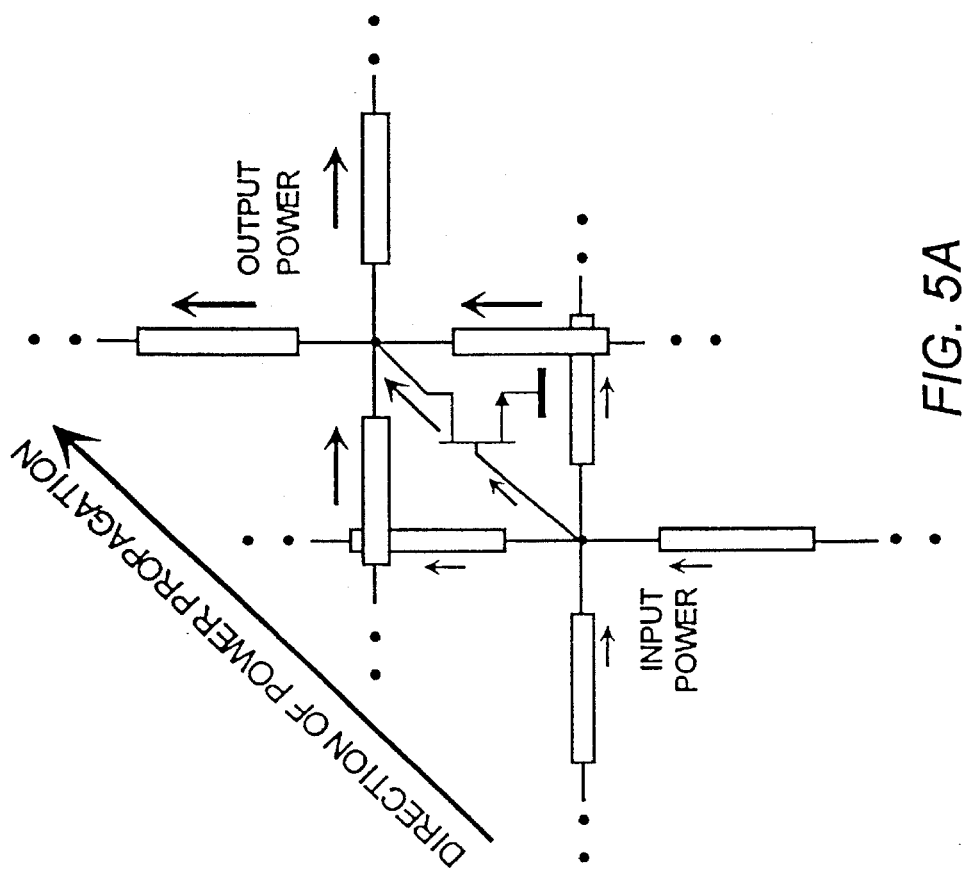
FIG. 5a is an isolated view of an inventive single interior device cell showing all adjacent transmission line segments connected to its input and output terminals. Vectors showing the flow of power around and through the cell are illustrated.

In order to further examine topological options for the two-dimensional array, it is useful to develop a simplified diagram of the power propagation through such an array. FIG. 5a shows a single FET cell extracted from the interior of the general circuit of FIG. 3a with its associated interconnecting line segments. FIG. 5b depicts the same circuit functions as FIG. 5a but the input and output transmission lines have been merged for simplicity of illustration as though a single conductor were capable of carrying both traveling waves.

Figure 6:
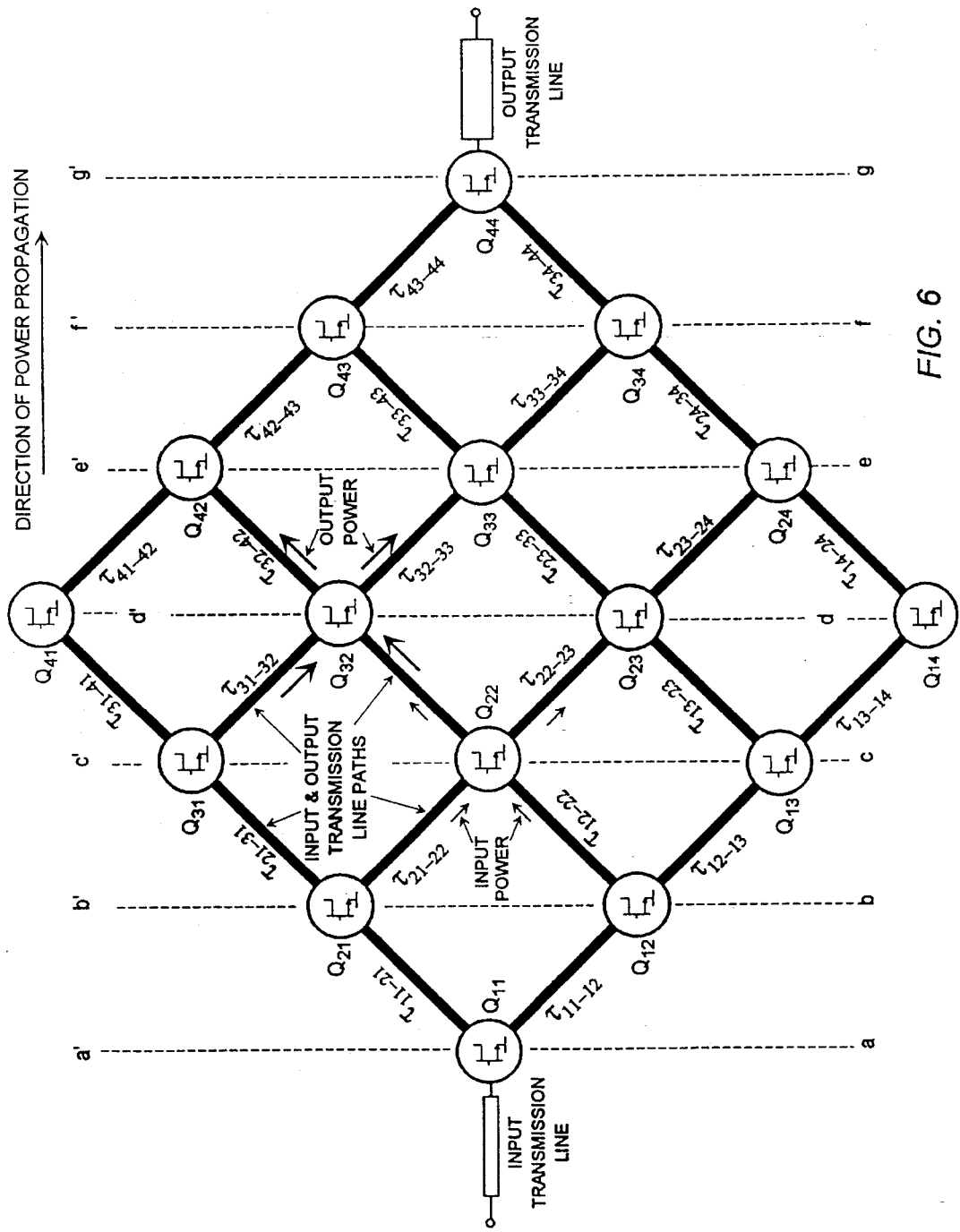
FIG. 6 shows an inventive 4×4 cell array using the symbology of FIG. 5b. Transmission delays between adjacent nodes are given as $\tau_{ij-kl}$. Reference planes a—a' through g—g' show constraints on interior propagation delay through the array.

A 4×4 cell power array drawn with this symbology is shown in FIG. 6. The array has been rotated 45° so that the direction of power propagation is horizontally across the page. The vertical dashed boundary lines indicate which ones of the FET cells $Q_{x,y}$ must be operating with signals that are mutually in phase, or more precisely that must have the same accumulated propagation delay from a prior plane of synchronization. Inspection of the subscripts on the devices reveals that all devices that have the same subscript sum, z where for $Q_{x,y}$, z=x+y operate precisely in phase with one another. This means that all of the interconnecting transmission lines between a given pair of boundary lines must have the same propagation delay. For example, between the boundaries b—b' and c—c' there exist 8 paths (four input and four output). They all must have the same total propagation delay, $$\tau_{bc} = \tau^{IN}_{21-31} = \tau^{IN}_{21-22} = \tau^{IN}_{12-22} = \tau^{IN}_{12-13}$$
$$= \tau^{OUT}_{21-31} = \tau^{OUT}_{21-22} = \tau^{OUT}_{12-22} = \tau^{OUT}_{12-13}.$$

These delays are produced by the combination of synthetic line segments, the cell input and output compensating inductances of FIG. 4, associated with the inductive compensation of the cell capacitances and actual transmission lines inserted to make up any residual differences, the input and output connecting transmission lines also shown in FIG. 4.

Once the appropriate delay compensations have been made throughout the array, it becomes possible to truncate the array at any boundary line in order to define a new device with $k^{IN}$ input nodes and/or $k^{OUT}$ output nodes in order to simultaneously meet the gain and drive power requirements of a non-uniformly distributed power amplifier cascade.

Figure 3B:
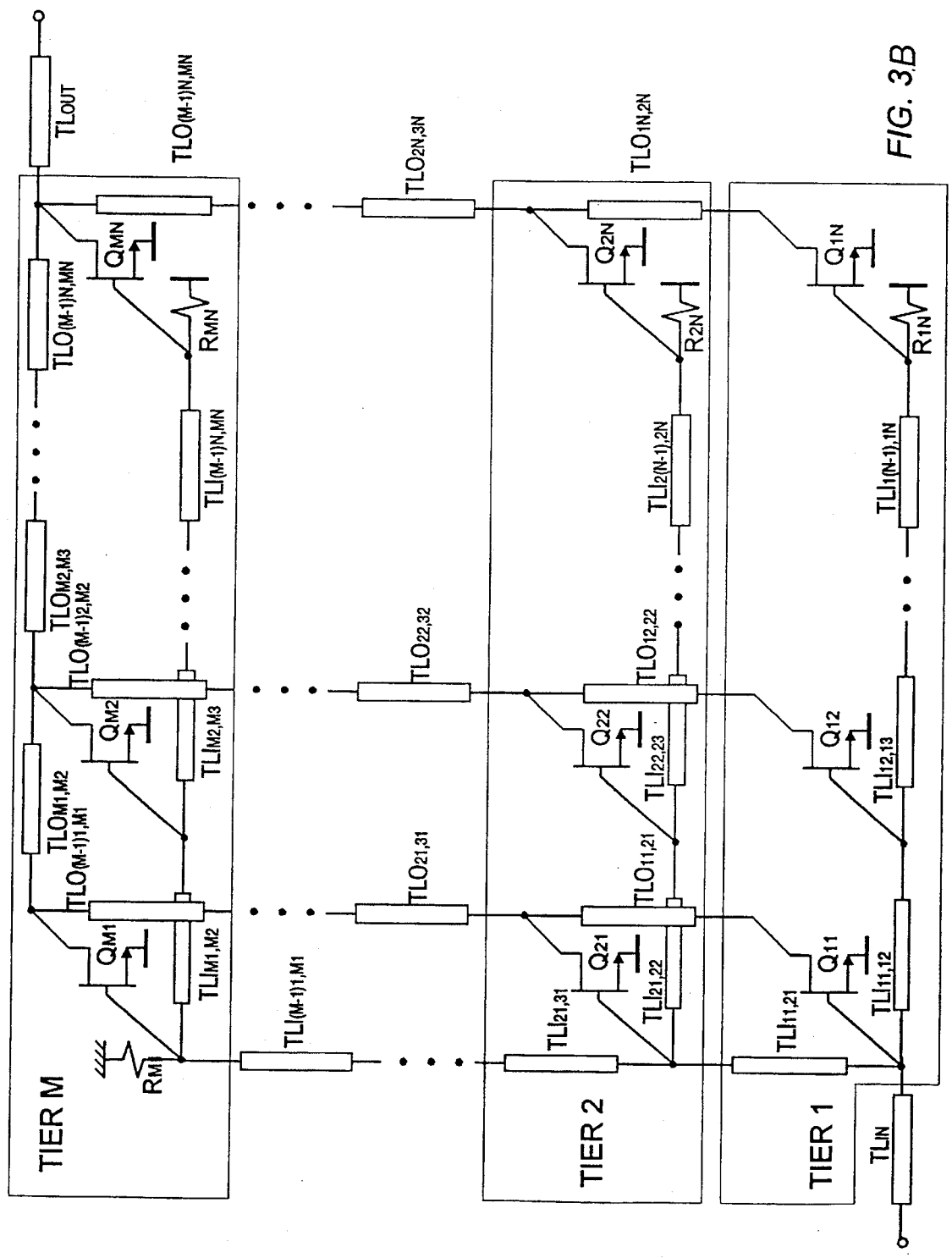
FIG. 3b is a block diagram of an inventive two-dimensional distributed power device array with row input interconnection and column output interconnection.

FIG. 3b is a block diagram of an inventive two-dimensional distributed power device array comprised of cells with only row input interconnection and only column output interconnection. Power dispersion to the input rows is accomplished with a single column input line while power collection takes place along a single row output line.

Third Embodiment

Figure 7:
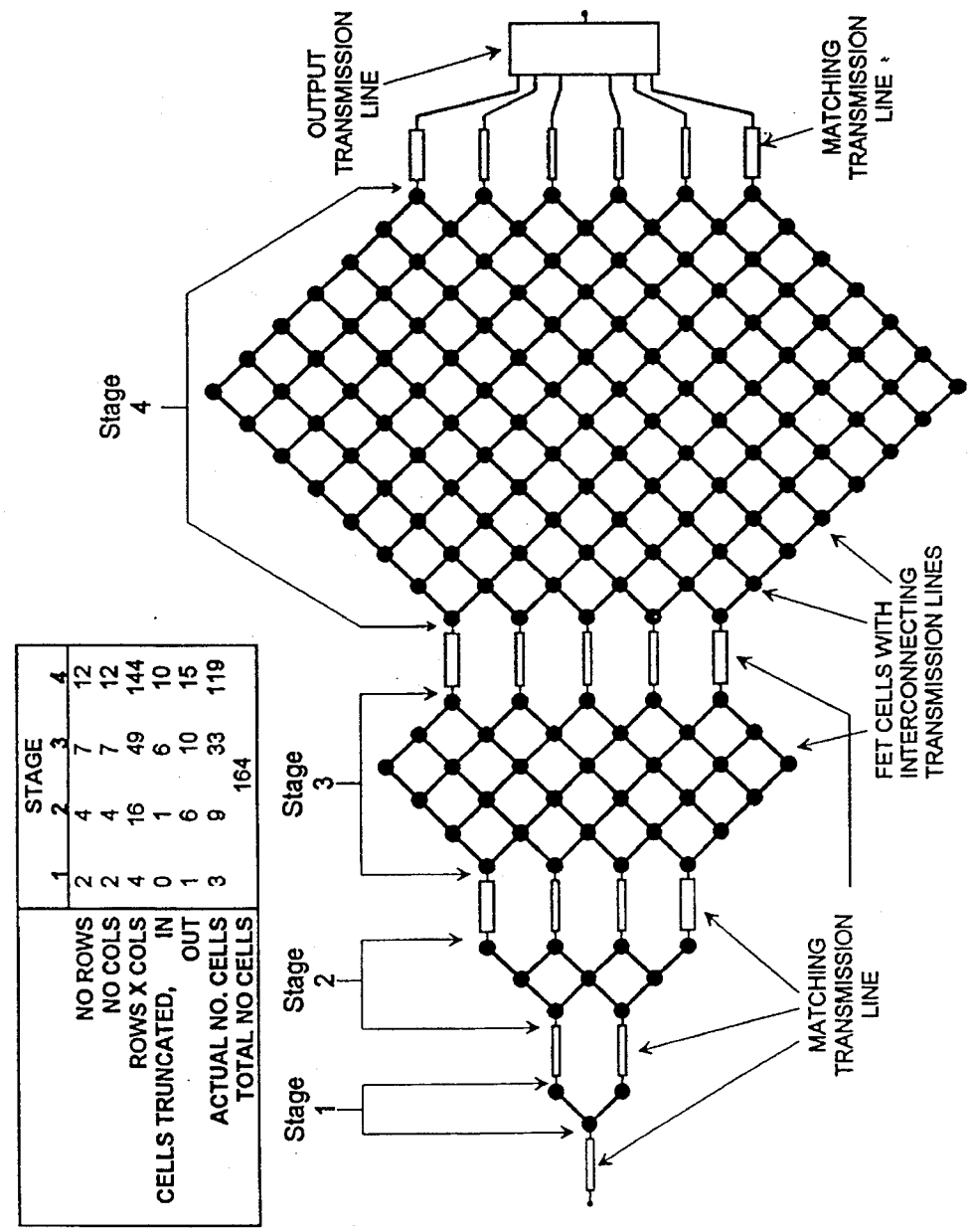
FIG. 7 shows an inventive high gain power amplifier composed of four truncated power-array stages. In this example, the device cells are assumed to be identical among the four stages as well as throughout each of the stages.

A third embodiment of the invention is a high-gain non-uniformly distributed power amplifier including a cascade of individual non-uniformly distributed two-dimensional arrays as shown in FIG. 7. The amplifier in FIG. 7 has four distributed power arrays of progressively increasing array size. All of the device cells are assumed to be identical throughout the entire amplifier cascade. Truncation has been employed to maintain tractable impedances within the structure.

As with the first two embodiments, the load conditions presented to every device cell throughout the four stage amplifier are identical. Therefore, conditions of maximum efficiency and/or maximum power output may be maintained over a wide frequency range even in the face of changing overall gain or power requirements. For the example of FIG. 7, TABLES 2 and 3 summarize the expected performance for a microwave FET power cell having the electrical characteristics of TABLE 1.

TABLE 1

Typical power FET cell characteristics at 20 GHz.

| FREQUENCY: | | |
|---|---|---|
| (transition) | $F_T$ | 40 GHz |
| INPUT: | | |
| series R | $R_{GS}$ | 6 Ohm |
| series C | $C_{GS}$ | 400 fF |
| parallel R | $R_{GP}$ | 75 Ohm |
| parallel C | $C_{GP}$ | 350 fF |
| OUTPUT: | | |
| parallel R | $R_{DP}$ | 1 KOhm |
| parallel C | $C_{DP}$ | 10 fF |
| POWER: | | |
| optimum load R | $R_L$ | 75 Ohm |
| max power out | $P_{OUT}$ | 125 mw |
| EFFICIENCY: | | |
| (power added) | η | 50% |

TABLE 2

Expected characteristics of the four individual stages of the amplifier of FIG. 7.

| STAGE | No. cells | $P_{IN}$ (Watt) | Gain (dB) | $P_{OUT}$ (Watt) | $\eta_{ADDED}$ (%) |
|---|---|---|---|---|---|
| 1 | 3 | 0.09 | 6 | 0.37 | >40 |
| 2 | 9 | 0.28 | 6 | 1.1 | >40 |
| 3 | 33 | 1 | 6 | 4.1 | >40 |
| 4 | 119 | 3.7 | 6 | 15 | >40 |

TABLE 3

Expected overall characteristics of the four-stage amplifier of FIG. 7.

| Total Number of Cells | $N_Q$ | 164 |
|---|---|---|
| Impedance | | |
| (Input) | $Z_{IN}$ | 20 + j0 Ohms |
| (Output) | $Z_{OUT}$ | 2 @ 2.4 + j0, Ohms |
| | | 4 @ 5 + j0 Ohms |

TABLE 3-continued

Expected overall characteristics of the four-stage amplifier of FIG. 7.

| Power | | |
|---|---|---|
| Input | $P_{IN}$ | 100 mW |
| Gain | $G_P$ | >20 dB |
| Output | $P_{OUT}$ | ~15 Watts |
| Power-added Efficiency | η | ~35% |
| Frequency Response | ΔF | 0.1–14 GHz |

Figure 8:
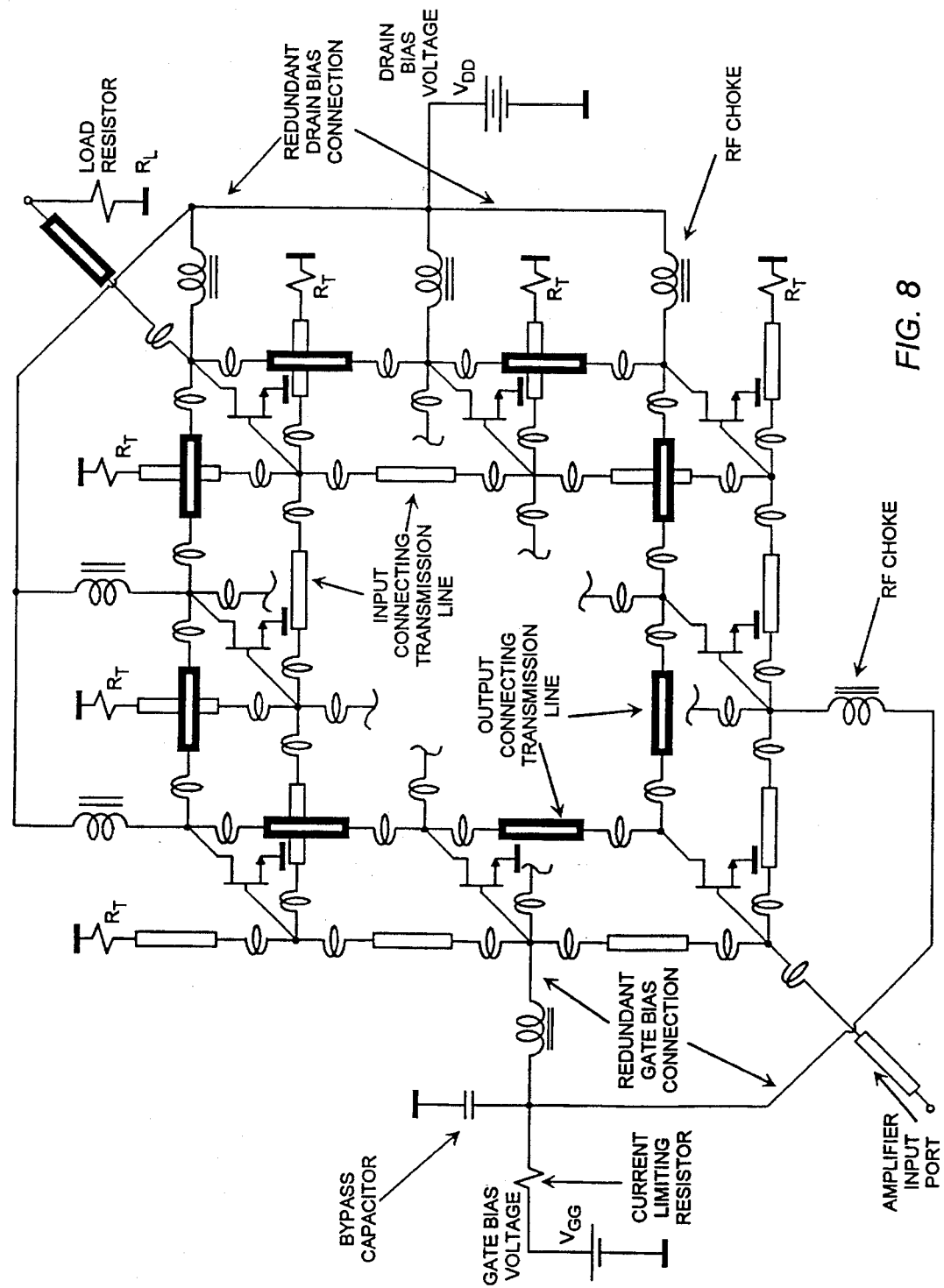
FIG. 8 shows a schematic of the outer eight cells of a 3×3 cell array (the center cell has been omitted to simplify the drawing) which includes a suitable method of providing bias currents and voltages to the amplifier.

As with the first and second embodiments, all of the device cells may be directly connected so that the entire device aggregate appears as one large device for the purposes of applying DC bias. In practice several redundant connections should normally be used to accommodate the high bias currents and provide a high degree of reliability as shown in FIG. 8.

For all embodiments of the non-uniformly distributed power amplifier, the output network impedances are uniquely determined by the load requirements and power capabilities of the device cell together with the required overall output power. The choice of input network impedances is not quite so rigid. The termination resistance, or set of resistances for a multidimensional array, of the input network is a selectable design parameter. Reducing this resistance results in lower characteristic impedances throughout the rest of the network. Since the characteristic impedance of a synthetic line is equal to $Z_0=\sqrt{L/C}$, a lower characteristic impedance implies a lower required compensating inductance. The cutoff frequency, $f_{co}$, where the transmission line approximation for the L-C network becomes invalid is given by $f_{co}=1/\sqrt{L \times C}$. Therefore a lower terminating impedance results in higher cutoff frequencies and a wider amplifier operating frequency range.

Reduction of the terminating impedance also means that, for a particular FET cell with a specific equivalent input parallel resistance, $R_{GP}$, the proportion of input power which becomes terminated in that resistance also increases. The specific relationship between terminating resistance and input circuit loss for both one- and two-dimensional distributions is discussed latter herein. The final design of the input circuit is resolved by balancing the amplifier's bandwidth requirements against its overall efficiency requirements. Typically an input circuit loss of approximately 1 dB is considered optimum.

Other enhancements to the design may be incorporated to address problems or conditions unique to a particular device type or application. One such example is the addition of networks to improve overall amplifier stability in the presence of defective or anomalous cells. Normally, a non-uniformly distributed power amplifier is comprised of a plurality of identical power device cells. Under these circumstances the arrays behave as predicted and the overall stability of the amplifier is predictable. In the case of an array comprised of a plurality of cells that are not identical, the amplifier's performance departs from the ideal.

The one-dimensional array is relatively insensitive to cell variations because it does not depend upon balanced conditions as does the two-dimensional array. Therefore compensation for cell variation is most easily addressed by conservative load and input impedance selection.

Two-dimensional arrays depend upon conditions of symmetry for proper operation which require relatively well matched cells. Although monolithic fabrication of a rather large number of nearly identical closely spaced cells is quite practical, it is desirable to have additional methods to deal with defective device cells. Referring again to FIG. 6, the planes of equal propagation delay (a—a' through g—g') also identify sets of device cells which, under ideal conditions, may be interconnected without affecting the overall performance of the amplifier. Because every cell throughout the array is operating with the same gate and drain voltage waveform, those devices that are also operating in the same phase may be directly connected without altering the normal operating conditions. For example, resistors may be connected from the gate of $Q_{41}$ to the gate of $Q_{32}$ and from the drain of $Q_{41}$ to the drain of $Q_{32}$, etc. throughout the array. Under normal conditions the presence of the resistors does not affect the circuit operation. When the array becomes imbalanced due to a change in device characteristics, however, current flows through the differential mode terminations to dissipate the anomalous power.

Multi-dimensional arrays delivering the highest output powers must invariably be truncated in order to permit reasonable operating impedances at the output. Although it is true that ultimately the outputs will likely be connected to a single port, it is not necessary for that port to present a very low impedance. Each of the output contributions may be individually transformed to a more convenient impedance over the desired operating band and combined after the transformation. Even if the very broadest bandwidths are required, necessitating a minimum of transformation, the multiplicity of outputs permits collecting the power in a manner most appropriate to the output environment. For example, if a single low impedance microstrip port is required, the individual amplifier outputs may be symmetrically offset toward the edges of the output transmission line as shown in FIG. 7, in order to match the non-uniform current distribution across the width of a microstrip conductor. An exact analysis of the proper placement is most effectively performed with the aid of electromagnetic simulation software.

Because of the extent of the differences in design and circuit attributes between the non-uniformly distributed power amplifier and conventional power amplifier approaches, a concise description of the performance improvements is problematic. This is particularly true of the multidimensional realization of the invention. Nevertheless certain arbitrary examples may serve to highlight the principal advantages.

The maximum power output of a uniformly distributed amplifier (assuming the circuit is lossless and comprised of ideal device cells which are limited only to finite output current and voltage ranges) containing $N_Q$ cells is approximately $PMAX_{UNIF}=N_Q \times P_Q/2$. J. L. B. Walker, "Some Observations on the Design and Performance of Distributed Amplifiers", *IEEE Trans. Microwave Theory Tech.*, Vol. MTT-40, January 1992. This is the same power output that one would expect at DC in an amplifier that is feeding the two identical loads located at either end of the output transmission line. Although phase cancellation upsets the frequency behavior of the output power delivered to the dummy termination at higher frequencies, a well designed uniformly distributed amplifier will still deliver the same power throughout its operating band that it delivers at DC. A non-uniformly distributed amplifier with the same idealized assumptions, however, will deliver to its load simply $PMAX_{NONUNIF}=N_Q \times P_Q$. Therefore, the non-uniformly distributed amplifier is capable of delivering twice the power available from a uniformly distributed amplifier.

Perhaps even more important than the power output capability is the efficiency, which is also increased by a factor of two. The higher efficiency implies a further increase in overall power gain and output power and/or a reduction in required prime power, which may be a critical resource, e.g. man-portable and space applications. In many situations, especially those where active devices are located in close proximity to one another, an increase in device junction temperature brought about by power dissipation within circuits operating at low efficiency becomes the prime power limiting factor in the design.

TABLE 4 shows a comparison of the approximate performance characteristics expected from several possible amplifier configurations using a device with the characteristics of TABLE 1. The following circuits are compared:

1 a uniformly distributed 1×8 cell amplifier designed for maximum power output.

2 a non-uniformly distributed 1×8 cell power amplifier.

3 a conventionally designed power amplifier employing conjugate impedance matching of parallel cells.

4 a non-uniformly distributed 7×7 cell power array with six cells truncated from both input and output corners of the array.

TABLE 4

Computed performance of several power amplifier realizations.

| | CIRCUIT TYPE | | | |
|---|---|---|---|---|
| | #1 TWA (1 × 8) | #2 NTWA (1 × 8) | #3 CHIP LEVEL | #4 NTWA (7 × 7) |
| No. stages | 1 | 1 | 1 | 1 |
| No. cells | 8 | 8 | 4 | 37[1] |
| Output Power (W) | 0.5 | 1 | 0.5 | 4.6 |
| Bandwidth (GHz) | 20 | 20 | 0.5 | 14 |
| Center Frequency (GHz) | 10 | 10 | 20 | 7 |
| Efficiency[2] (%) | 20% | 40% | 45% | 35% |
| Input Impedance (Ohm) | 7 | 7 | 1[3] | 2:4.7 2:9.5 |
| Load Impedance (Ohm) | 18 | 9 | 20 | 2:4.5 2:9.0 |
| Power Gain (dB) | 3[4] | 6 | 6 | 6 |
| Power × Bandwidth (W-GHz) | 10 | 20 | 0.25 | 60 |

[1] 6 cells removed from input corner and 6 cells removed from output corner
[2] power added efficiency
[3] design limit
[4] low gain due to tuning for maximum power output Inspection of TABLE 4 reveals that the uniformly distributed amplifier #1 is limited in output power and efficiency by comparison to the non-uniformly distributed amplifier #2. The chip-combined amplifier #3 represents nearly the best that can be achieved with conventional conjugate power-matched design techniques. Although the efficiency of this amplifier is nearly optimum at band center, the 1-dB bandwidth is only about 3%. Furthermore its power output is limited by impedance considerations as discussed below. Amplifier #4 is configured to take maximum advantage of the two-dimensional non-uniformly distributed power array configuration. Implemented in this form, the amplifier delivers nearly a factor-of-ten higher power than its nearest competitor over a very wide frequency range.

As is often the case, the table does not tell the whole story. As noted in the table, the input impedance of amplifier #3 is approximately one ohm, which is considered about the minimum reasonable level for efficient impedance transformation. Any further power increases must be obtained through the use of conventional passive power combiners which are designed in a relatively high-impedance environment. Since these must be located at a considerable electrical distance from the amplifying devices they will introduce substantially higher combining losses. Therefore ½ watt is approximately the highest power output available at 20 GHz from these particular devices when connected directly in parallel and embedded in a conventional conjugate power matching network. The power outputs of the other amplifiers may be substantially increased without dropping below the one-ohm threshold.

If the FET cell can be made smaller without sacrificing its operating voltage range, the frequency response of amplifiers #1, #2, and #4 may be further extended. The associated reduction in the device capacitance results in higher synthetic transmission line cutoff frequencies. This is true because an amplifier at the same power level is realized with a larger number of FET cells that are interconnected with a commensurably larger number of line segments and compensating inductances. Since the interconnecting elements are also smaller (in transmission line length or inductance value), they more closely approximate a continuous transmission line. This means that the bandwidth performance of amplifier #4 may be extended to match that of amplifiers #1 and #2 without decreasing any of the other performance characteristics by employing an increased number of smaller FET cells.

Although the output power of amplifier #1 may be increased by adding more cells without hitting a fundamental impedance limit, the reduction in efficiency associated with the dummy output load makes it an unattractive configuration by comparison to amplifiers #2 and #4. Many recent distributed amplifier designs do incorporate some nonuniformity into their power distribution networks usually by employing some sort of digital computer optimization as an aid to selecting specific component values. This results in some performance improvement over that shown in TABLE 4. Any residual variation in electrical operating conditions among the device cells, however, diminishes the potential performance of a distributed amplifier under high power operating conditions.

As with any distributed amplifier, the non-uniformly distributed power amplifier offers an extremely wide useful bandwidth and a nearly pure real input impedance. There are further advantages of the invention, however, which may be grouped into four general categories. These are advantages in design, performance, reliability, and manufacturing. To a large extent, these advantages are attributable to the fact that many traditionally conflicting power amplifier design requirements are made independent through the use of non-uniformly distributed cell combining. For example, amplifiers of virtually any power level may be composed of the very smallest device cells, load and input impedances may be altered to some degree without significantly affecting cell or overall amplifier performance, and cell spacing may be arbitrarily adjusted to accommodate physical, electrical or thermal constraints.

The ability to truncate large power arrays enables the amplifier designer to interconnect the resultant set of ports in the most advantageous way. In many cases the connections are intermediate between cascaded stages where the adjacent stage may be truncated to match. When the port set must feed a load, the multiple outputs may be connected to electromagnetically matched feed points in the external circuit. In reality, the presence of a set of defined ports at the output of a non-uniform distributed power amplifier should be compared to the output of a typical contemporary power transistor which typically contains a similar number of somewhat arbitrarily placed output interconnects. The truncated array permits precise definition of the interconnect impedances.

The topological flexibility offered by the two-dimensional power array serves to greatly facilitate the design of cascaded high-power amplifiers. Since amplifier stages of any power capability may be derived from the smallest device cells, intermediate stages are readily obtained. Furthermore, binary combinations offer no particular advantage. This "basic building block" attribute of the power array is especially advantageous to the fabrication of the constituent device cells. The device fabricator is free to concentrate on producing an elemental power device which offers the highest specific performance, i.e. the highest power-added efficiency, per-unit output power, and cut-off frequency. All issues associated with the design of a device tailored to a particular power application are addressed through the interconnection of passive components in a monolithic network composed of these cells. Under such circumstances the device designer is free to focus on fundamental device improvements.

Calculation of Line Impedances for Progressively Power Combined Arrays

The calculation of the output transmission line impedances required for a two-dimensional progressively-combined power array is most easily accomplished by considering the reciprocal problem of distributing power to an array of equal loads. Each line impedance in the array must therefore be chosen so as to produce a match terminated condition.

Figure 9:
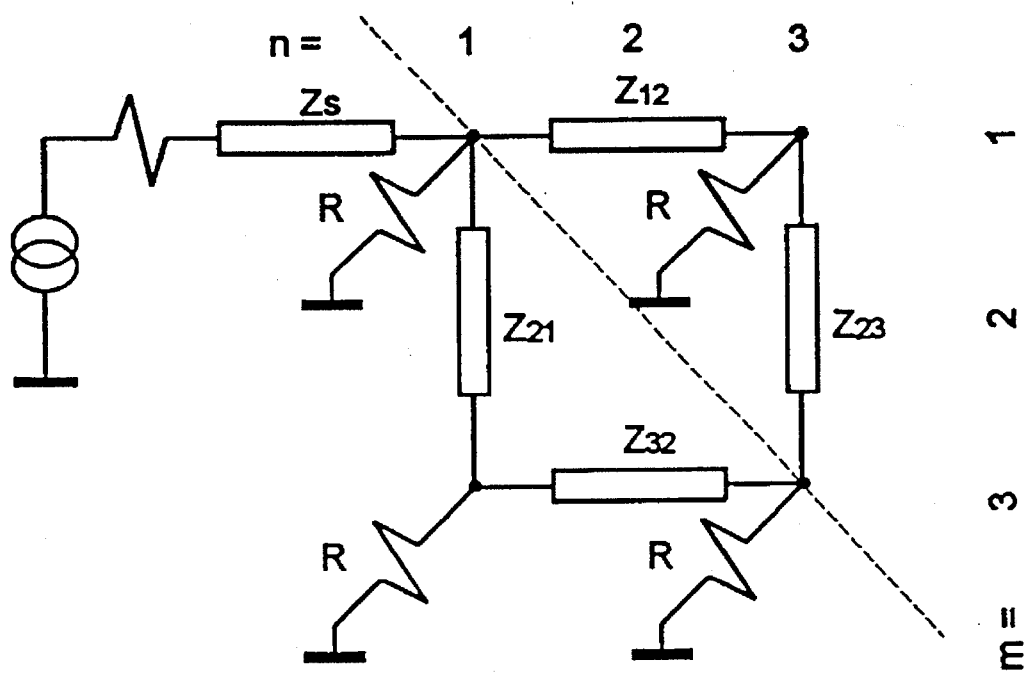
FIG. 9 shows a four cell power array.

FIG. 9 shows a four-cell power array consisting of two rows and two columns of load resistors "R." Power enters the array at one corner and propagates toward the diagonally opposite corner. Clearly the array must be symmetrical about the line of propagation ($Z_{i,j}=Z_{j,i}$). Therefore, the analysis may be restricted to the network shown in FIG. 10.

Figure 10:
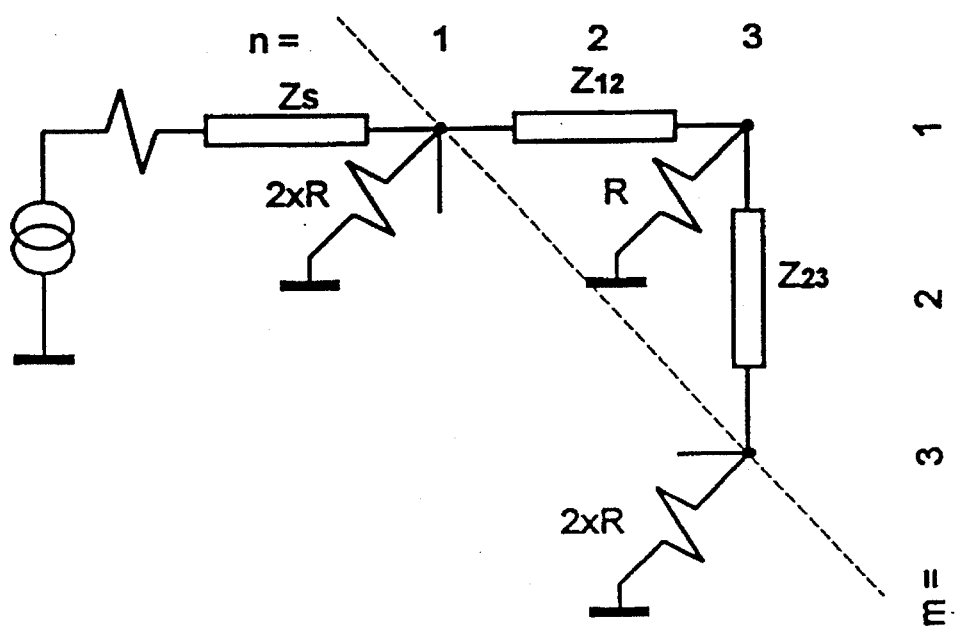
FIG. 10 shows a four cell equivalent array based upon lateral symmetry.

In order to unambiguously specify each of the connecting line impedances with a two-dimensional matrix it is convenient to assign each interconnection to its own matrix position as indicated in the row/column numbering system shown in FIGS. 9 and 10. Under these circumstances the matrix which defines the intercell impedances for an array of m×n cells must be composed of 2m-1 rows and 2n-1 columns. Therefore, the dimensions of a 2×2-cell impedance array are 3 rows by 3 columns. Under this system of identification, every alternate matrix position (defined by i+j=even) is associated not with a connecting line, but with a load resistor. Therefore these positions in the matrix contain the value 0.

For the case of FIG. 10, the line $Z_{2,3}$ shares in delivering power to the final load with the omitted line $Z_{3,2}$. Therefore, the impedance of this line must be $Z_{2,3}=2R$. $Z_{2,3}$ in parallel with R forms the load for $Z_{1,2}$. Therefore $$Z_{1,2} = \frac{1}{\frac{1}{R}+\frac{1}{2R}} = \frac{2}{3}R,$$

and the resultant diagonal matrix of interconnecting line impedances becomes, $$Z_{2\times 2} = \begin{bmatrix} 0 & \frac{2}{3} & 0 \\ & 0 & 2 \\ & & 0 \end{bmatrix} \times R.$$

The input impedance must be $$Zin_{2\times 2} = \frac{1}{\frac{1}{R}+\frac{2}{Z_{1,2}}} = \frac{1}{4}R$$

as expected for a parallel combination of 4 device cells.

Figure 11:
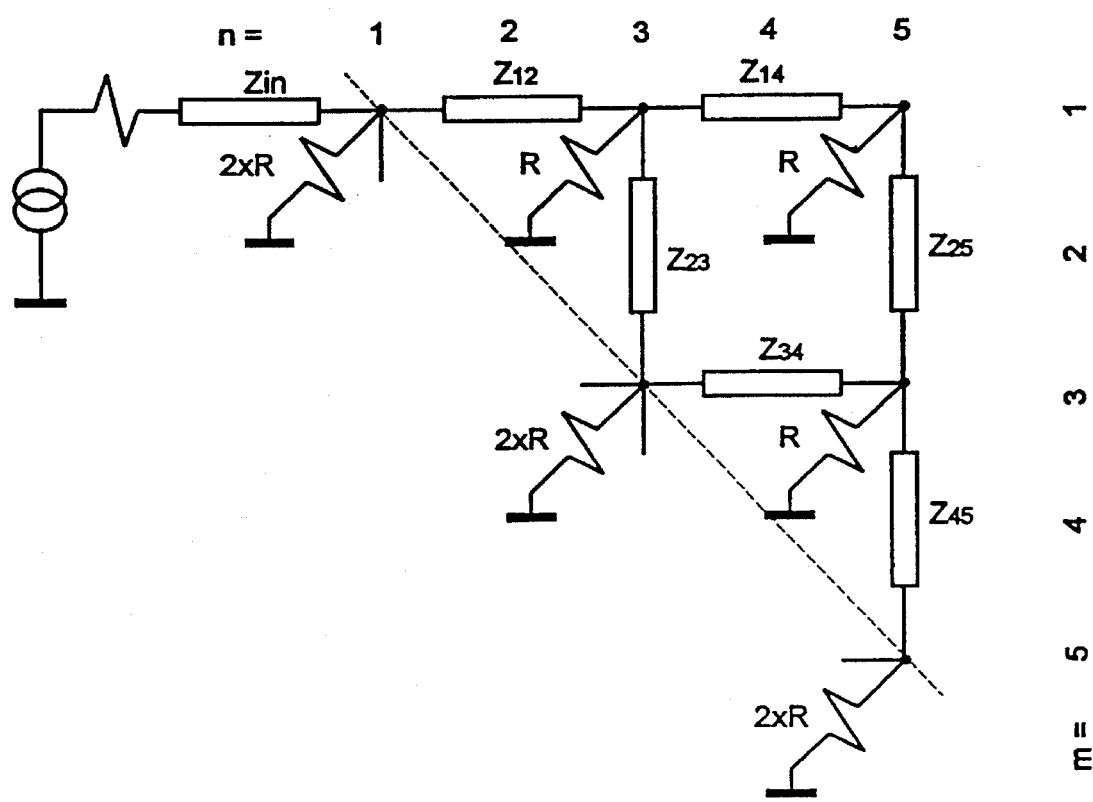
FIG. 11 shows a nine cell equivalent array.

A similar analysis may be performed on a simplied 3×3-cell army as shown in FIG. 11.

As before, the final line is loaded with 2R.
Therefore $Z_{4,5}=2R$.
Because they share the same load, $$Z_{2,5} = Z_{3,4} \frac{2}{\frac{1}{R}+\frac{1}{Z_{4,5}}} = \frac{4}{3}R$$

By similar methods, $$Z_{1,4} = \frac{1}{\frac{1}{R}+\frac{1}{Z_{2,5}}} = \frac{4}{7}R,$$

$$Z_{2,3} = \frac{1}{\frac{1}{2R}+\frac{1}{Z_{3,4}}} = \frac{4}{5}R, \text{ and}$$

$$Z_{1,2} = \frac{1}{\frac{1}{R}+\frac{1}{Z_{1,4}}+\frac{1}{Z_{2,3}}} = \frac{1}{4}R.$$

Again $$Zin_{3\times 3} = \frac{1}{\frac{1}{R}+\frac{2}{Z_{1,2}}} = \frac{1}{9}R = \frac{R}{m \times n}.$$

The full 3×3 diagonal per-unit impedance matrix becomes, $$\frac{Z_{3\times 3}}{R} \equiv Z_{pu_{3\times 3}} = \begin{bmatrix} 0 & \frac{1}{4} & 0 & \frac{4}{7} & 0 \\ & 0 & \frac{4}{5} & 0 & \frac{4}{3} \\ & & 0 & \frac{4}{3} & 0 \\ & & & 0 & 2 \\ & & & & 0 \end{bmatrix}$$

By similar analysis higher order arrays may be obtained.

$$Z_{pu_{4\times 4}} = \begin{bmatrix} 0 & \frac{2}{15} & 0 & \frac{16}{71} & 0 & \frac{8}{15} & 0 \\ & 0 & \frac{16}{33} & 0 & \frac{16}{25} & 0 & \frac{8}{7} \\ & & 0 & \frac{16}{25} & 0 & \frac{8}{7} & 0 \\ & & & 0 & \frac{4}{5} & 0 & \frac{4}{3} \\ & & & & 0 & \frac{4}{3} & 0 \\ & & & & & 0 & 2 \\ & & & & & & 0 \end{bmatrix}$$

A comparison of $Z_3$ and $Z_4$ shows that for $i,j \geq 2$, $$Z_{ij}^n = Z_{i+2,j+2}^{n+1}.$$

Therefore $$Z_{pu_{3\times 3}} = \begin{bmatrix} 0 & \frac{1}{4} & 0 & \frac{4}{7} & 0 \\ & & [M_3] & & \end{bmatrix},$$

where $M_3 = \begin{bmatrix} 0 & \frac{4}{5} & 0 & \frac{4}{3} \\ & 0 & \frac{4}{3} & 0 \\ & & 0 & 2 \\ & & & 0 \end{bmatrix}$ and $$Z_{pu_{4\times 4}} = \begin{bmatrix} 0 & \frac{2}{15} & 0 & \frac{16}{71} & 0 & \frac{8}{15} & 0 \\ & 0 & \frac{16}{33} & 0 & \frac{16}{25} & 0 & \frac{8}{7} \\ & & 0 & \frac{16}{25} & 0 & \frac{8}{7} & 0 \\ & & & & [M_3] & & \end{bmatrix}$$

$$= \begin{bmatrix} 0 & \frac{2}{15} & 0 & \frac{16}{71} & 0 & \frac{8}{15} & 0 \\ & & & [M_4] & & & \end{bmatrix}$$

The results for orders 5 through 8 are given below.

$$Z_{pu_{5\times 5}} = \begin{bmatrix} 0 & \frac{1}{12} & 0 & \frac{32}{259} & 0 & \frac{16}{75} & 0 & \frac{16}{31} & 0 \\ & 0 & \frac{32}{93} & 0 & \frac{32}{77} & 0 & \frac{4}{7} & 0 & \frac{16}{15} \\ & & 0 & \frac{32}{77} & 0 & \frac{4}{7} & 0 & \frac{16}{15} & 0 \\ & & & [M_4] & & & & & \end{bmatrix}$$

$$M_5 = \begin{bmatrix} 0 & \frac{32}{93} & 0 & \frac{32}{77} & 0 & \frac{4}{7} & 0 & \frac{16}{15} \\ & 0 & \frac{32}{77} & 0 & \frac{4}{7} & 0 & \frac{16}{15} & 0 \\ & & [M_4] & & & & & \end{bmatrix}$$

$$Z_{pu_{6\times 6}} = \begin{bmatrix} 0 & \frac{64}{1145} & 0 & \frac{256}{3259} & 0 & \frac{128}{1083} & 0 & \frac{64}{309} & 0 & \frac{32}{63} & 0 \\ & 0 & \frac{256}{965} & 0 & \frac{256}{837} & 0 & \frac{128}{337} & 0 & \frac{64}{119} & 0 & \frac{32}{31} \\ & & 0 & \frac{256}{837} & 0 & \frac{128}{337} & 0 & \frac{64}{119} & 0 & \frac{32}{31} & 0 \\ & & & [M_5] & & & & & & & \end{bmatrix}$$

$$M_6 = \begin{bmatrix} 0 & \frac{256}{965} & 0 & \frac{256}{837} & 0 & \frac{128}{337} & 0 & \frac{64}{119} & 0 & \frac{32}{31} \\ & 0 & \frac{256}{837} & 0 & \frac{128}{337} & 0 & \frac{64}{119} & 0 & \frac{32}{31} & 0 \\ & & [M_5] & & & & & & & \end{bmatrix}$$

$$Z_{pu_{7\times 7}} = \begin{bmatrix} 0 & \frac{1}{24} & 0 & \frac{512}{9397} & 0 & \frac{256}{3381} & 0 & \frac{256}{2223} & 0 & \frac{32}{157} & 0 & \frac{64}{127} & 0 \\ & 0 & \frac{512}{2379} & 0 & \frac{512}{2123} & 0 & \frac{128}{451} & 0 & \frac{256}{711} & 0 & \frac{64}{123} & 0 & \frac{64}{63} \\ & & 0 & \frac{512}{2123} & 0 & \frac{128}{451} & 0 & \frac{256}{711} & 0 & \frac{64}{123} & 0 & \frac{64}{63} & 0 \\ & & & [M_6] & & & & & & & & & \end{bmatrix}$$

$$M_7 = \begin{bmatrix} 0 & \frac{512}{2379} & 0 & \frac{512}{2123} & 0 & \frac{128}{451} & 0 & \frac{256}{711} & 0 & \frac{64}{123} & 0 & \frac{64}{63} \\ & 0 & \frac{512}{2123} & 0 & \frac{128}{451} & 0 & \frac{256}{711} & 0 & \frac{64}{123} & 0 & \frac{64}{63} & 0 \\ & & [M_6] & & & & & & & & & \end{bmatrix} = [M_{7a}]_{12\times 2}, [M_{7b}]_{12\times 10}$$

$$Z_{pu_{8\times 8}} = \begin{bmatrix} 0 & \frac{2}{63} & 0 & \frac{2048}{51131} & 0 & \frac{1024}{19387} & 0 & \frac{256}{3459} & 0 & \frac{256}{2257} & 0 & \frac{256}{1267} & 0 & \frac{128}{255} & 0 \\ & 0 & \frac{2048}{11333} & 0 & \frac{2048}{10309} & 0 & \frac{1024}{4527} & 0 & \frac{128}{473} & 0 & \frac{128}{367} & 0 & \frac{256}{501} & 0 & \frac{128}{127} \\ & & 0 & \frac{2048}{10309} & 0 & \frac{1024}{4527} & 0 & \frac{128}{473} & 0 & \frac{128}{367} & 0 & \frac{256}{501} & 0 & \frac{128}{127} & 0 \\ & & & [M_{7a}] & & & & & [M_{7b}] & & & & & & \end{bmatrix}$$

$$M_8 = \begin{bmatrix} 0 & \frac{2048}{11333} & 0 & \frac{2048}{10309} & 0 & \frac{1024}{4527} & 0 & \frac{128}{473} & 0 & \frac{128}{367} & 0 & \frac{256}{501} & 0 & \frac{128}{127} \\ & 0 & \frac{2048}{10309} & 0 & \frac{1024}{4527} & 0 & \frac{128}{473} & 0 & \frac{128}{367} & 0 & \frac{256}{501} & 0 & \frac{128}{127} & 0 \\ & & [M_{7a}] & & & & & [M_{7b}] & & & & & & \end{bmatrix} = [M_{8a}]_{14\times 4}, [M_{8b}]_{14\times 10}$$

Reactance Compensation

Figure 13:
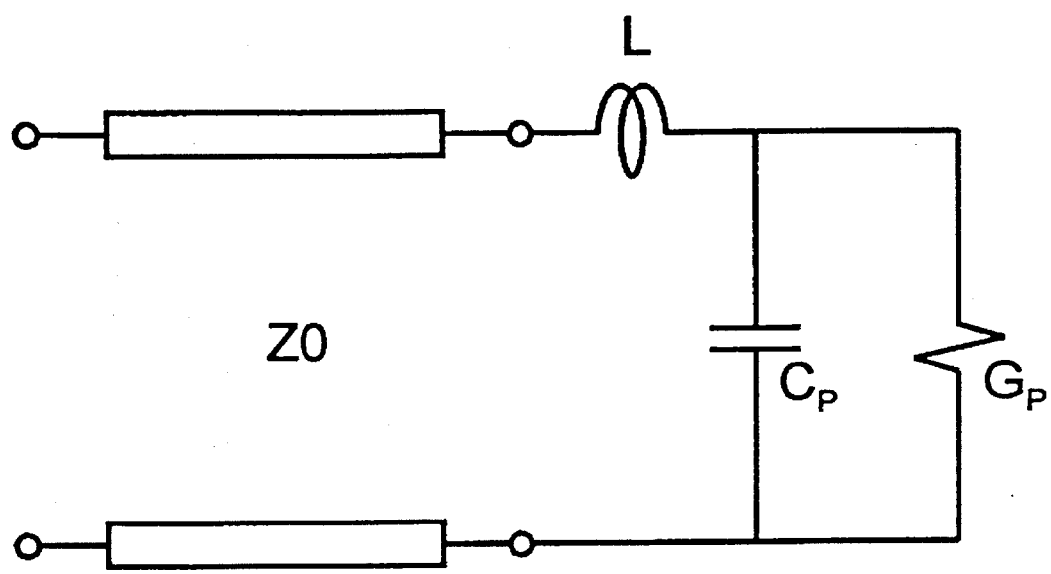
FIG. 13 shows a load conductance attached to a single transmission line.

For a simplified device equivalent circuit as shown in FIG. 12, the input and output equivalent circuits are represented by a shunt RC network. If a load conductance is attached to a single transmission line, as shown in FIG. 13, the characteristic impedance of the line should be the same as that of the load. The parallel capacitance may also be compensated with a series inductance such that the resulting L-network approximates the line characteristic impedance over a broad bandwidth. The characteristic impedance of the L-network is given by, $$Z0 = \sqrt{\frac{L}{C}}.$$

Therefore the inductance may be obtained from $$L = Z0^2 \times C.$$

As the operating frequency begins to approach the cutoff frequency defined by, $$f_c = \frac{1}{\pi \sqrt{LC}},$$

the reflection coefficient rises markedly. Since the capacitance usually cannot be reduced, it is necessary to lower the operating impedance in order to reduce the LC product and raise the cutoff frequency if that is desired.

As shown in FIG. 14, when the device is located at a junction of two transmission lines of differing characteristic impedance, as is always the case in the amplifier of the first embodiment and true at the corners of the second embodiment amplifier, the equivalent capacitance may be apportioned to inductors associated with the connecting lines so as to maximize the overall cutoff frequency. The maximum will of course occur when $fC_b=fC_b$. Under this condition $$L_a C_a = L_b C_b$$

therefore $$C_a^2 \times Z0_a^2 = C_b^2 \times Z0_b^2,$$

from which $$C_a = \frac{Z0_b}{Z0_a} \times C_b.$$

Since $C = C_a + C_b$, $$C_a = \frac{C}{1 + \frac{Z0_a}{Z0_b}}, \text{ and } C_b = \frac{C}{1 + \frac{Z0_b}{Z0_a}}.$$

Therefore $$L_a = \frac{Z0_a^2 \times C}{1 + \frac{Z0_a}{Z0_b}}, \text{ and } L_b = \frac{Z0_b^2 \times C}{1 + \frac{Z0_b}{Z0_a}}$$

If for example the impedances $Z0_a$ and $Z0_b$ are equal, the capacitances $C_a$ and $C_b$ would likewise be equal and equal to ½ of the total device capacitance. Under such circumstances the inductances $L_a$ and $L_b$ would also be halved in order to maintain the same characteristic impedance. The cutoff frequency of the resultant L-sections would be doubled as compared to a single L-section at the same impedance level.

Figure 15:
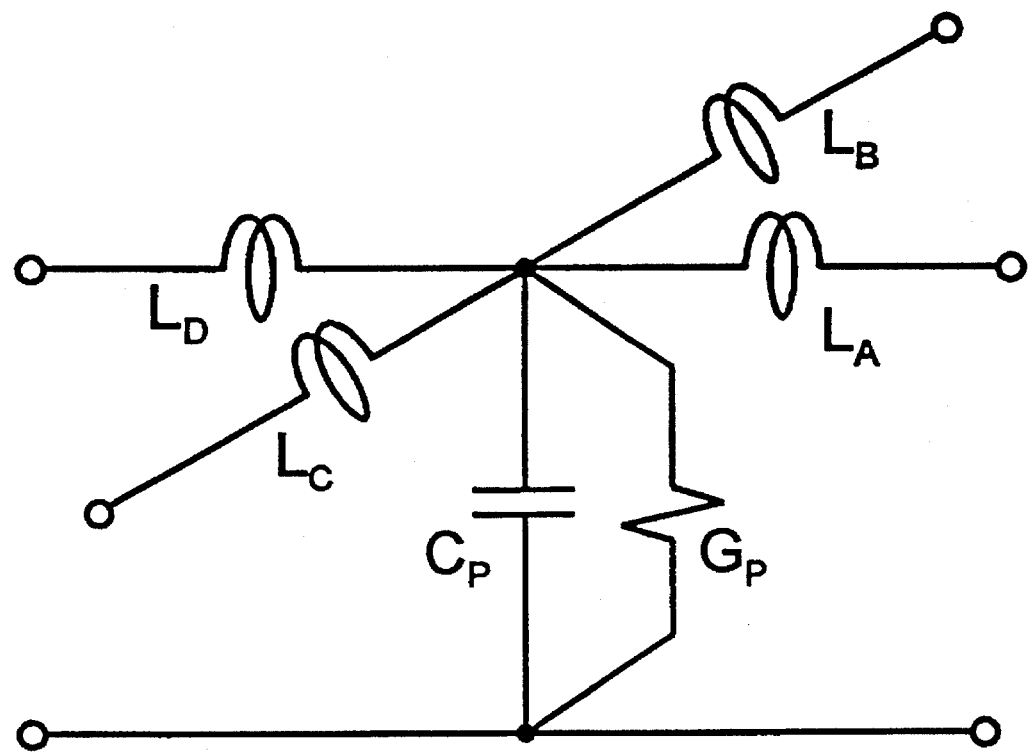
FIG. 15 shows a device at the junction of four transmission lines.

It is easy to extend the analysis to include intersections of a larger number of transmission lines. A junction of four lines (the most complex interconnection required for a planar distributed power array) is shown in FIG. 15.

For the case of a three-line intersection, which is true along the sides of the second embodiment amplifier, the capacitance values become $$C_a = \frac{C}{\left(1 + \frac{Z0_a}{Z0_b} + \frac{Z0_a}{Z0_c}\right)},$$

$$C_b = \frac{C}{\left(1 + \frac{Z0_b}{Z0_a} + \frac{Z0_b}{Z0_c}\right)}, \text{ and}$$

$$C_c = \frac{C}{\left(1 + \frac{Z0_c}{Z0_a} + \frac{Z0_c}{Z0_b}\right)}.$$

For a four-line intersection, $$C_a = \frac{C}{\left(1 + \frac{Z0_a}{Z0_b} + \frac{Z0_a}{Z0_c} + \frac{Z0_a}{Z0_d}\right)},$$

$$C_b = \frac{C}{\left(1 + \frac{Z0_b}{Z0_a} + \frac{Z0_b}{Z0_c} + \frac{Z0_b}{Z0_d}\right)},$$

$$C_c = \frac{C}{\left(1 + \frac{Z0_c}{Z0_b} + \frac{Z0_c}{Z0_a} + \frac{Z0_c}{Z0_d}\right)}, \text{ and}$$

$$C_d = \frac{C}{\left(1 + \frac{Z0_d}{Z0_b} + \frac{Z0_d}{Z0_c} + \frac{Z0_d}{Z0_a}\right)}.$$

In each case of course the corresponding inductances are obtained by $$L_x = C_x \times Z0_x^2$$

Input Circuit Loss

Figure 16:
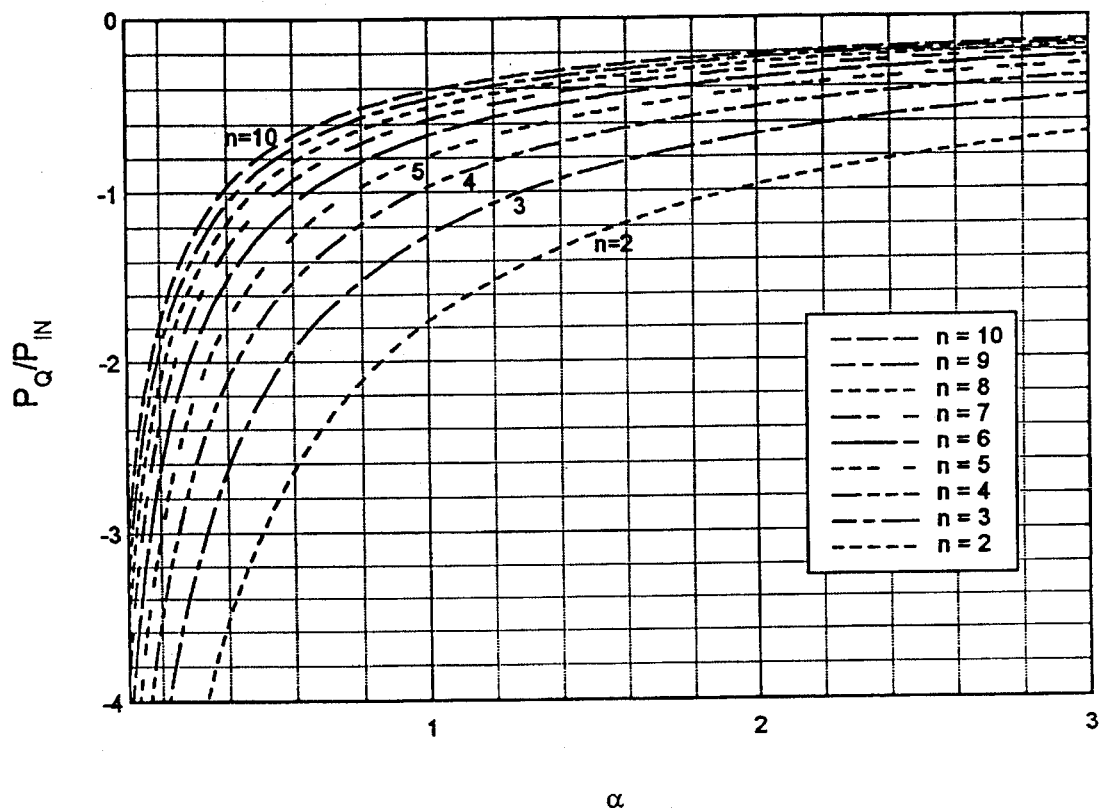
FIG. 16 is a graph of the power lost in an input network of a linear distribution of power cells as a function of the ratio of the terminating resistance and the equivalent parallel device.

FIG. 16 contains curves showing the amount of power lost (in dB) to an input network termination in a linear distribution of power cells as a function of the ratio between the terminating resistance and the equivalent parallel device $R_{GP}$. The loss is given by the equation, $$P_Q/P_{IN} = 10 \times \text{Log}\left[\frac{n \times \rho}{1 + n \times \rho}\right], \text{ where}$$

$$\rho = R_T/R_{GP}.$$

Maintaining an input circuit loss under 1 dB with moderate terminating values is relatively easy, especially for larger numbers of cells.

Figure 17:
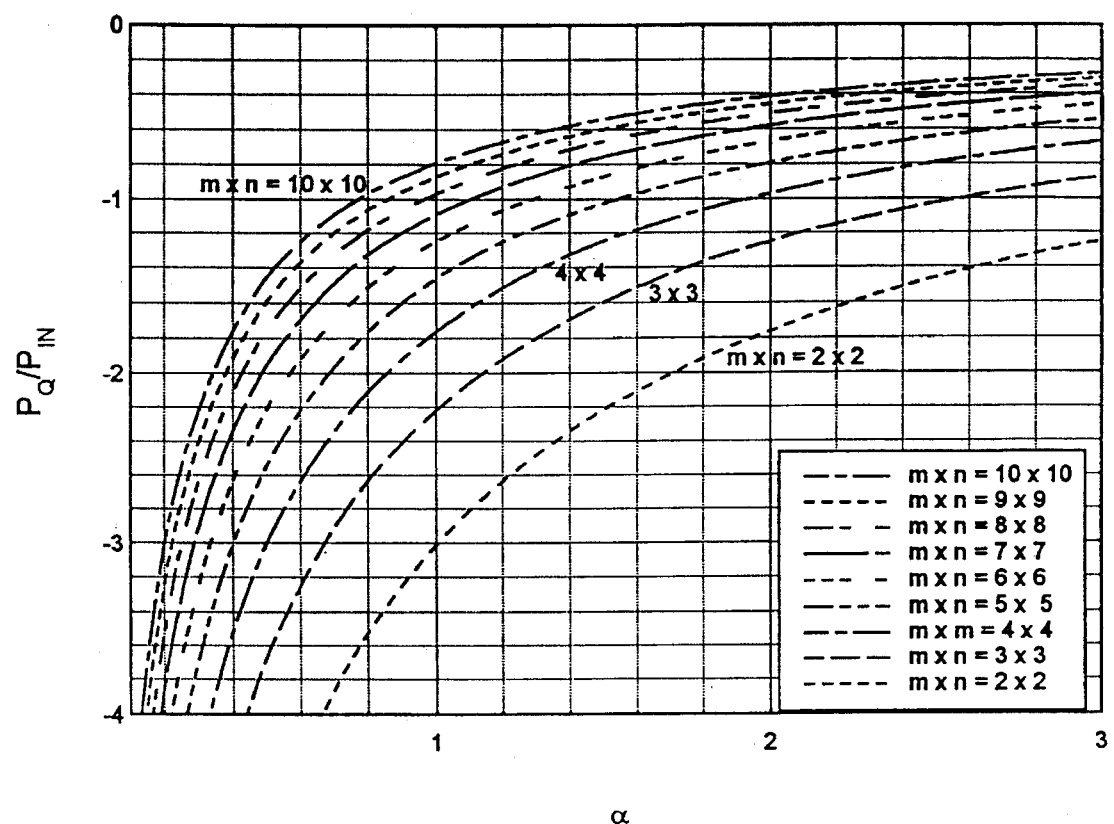
FIG. 17 is a graph of the power lost in an input network of a two dimensional distribution of power cells as a function of the ratio of the terminating resistance and the equivalent parallel device.

Similar curves for square device arrays are shown in FIG. 17. In this case the loss is given by, $$P_Q/P_{IN} = 10 \times \text{Log}\left[\frac{m \times n \times \rho}{m + n + m \times n \times \rho}\right],$$

where $\rho$ is defined above. Note however that the two-dimensional array contains m+n terminating resistors. Therefore the total input equivalent shunt termination is, $$R_T = R_T/(m+n).$$

Conclusion

An inventive amplifier has been described which optimally combines the outputs of a plurality of amplifying devices to produce the highest output power levels. The non-uniformly distributed power amplifier permits the production of power levels approaching a factor-of-ten higher than any other circuit technology that does not employ externally-connected passive power combining networks. Because passive power combiners with their associated losses are not required, the non-uniformly distributed power amplifier permits power conversion at the highest levels of efficiency across its full operating band, approaching the efficiency of more narrow-band amplifier designs.

The non-uniformly distributed power array may be configured in variety of ways based on a single elemental active device cell to suit the particular application. Therefore, the requirement for a semiconductor foundry to "inventory" a variety of power devices is removed. Device and circuit developments may proceed on different tracks, the manufacturer is able to offer a richer product mix, and product development and production costs will be reduced.

The invention has been described herein with reference to several specific embodiments. The description is illustrative of the invention and is not to be construed as limiting the invention. Various modifications may occur to those skilled in the art without departing from the true spirit and scope of the invention as defined by the appended claims.

I claim:

1. A distributed broadband amplifier, comprising:

a two-dimensional array of active devices;

a two-dimensional input network including a grid of interconnected conducting input segments enabling input signals to propagate between input terminals of the active devices; and a two-dimensional output network including a grid of interconnected conducting output segments for collecting output signals generated at output terminals of the active devices.

2. An amplifier as claimed in claim 1, wherein the input segments of the two-dimensional input network radiate in two dimensions from the input terminals of the active devices to interconnect the input terminals of the active devices in two dimensions.

3. An amplifier as claimed in claim 1, wherein the output segments of the two-dimensional output network radiate in two dimensions from the output terminals of the active devices to interconnect the output terminals of the active devices in two dimensions.

4. An amplifier as claimed in claim 1, wherein the input signals propagate in two dimensions across the input network.

5. An amplifier as claimed in claim 1, wherein the output signals propagate in two dimensions across the output network.

6. An amplifier as claimed in claim 1, wherein each one of the input segments of the two-dimensional input network connects input terminals of adjacent active devices.

7. An amplifier as claimed in claim 1, wherein each one of the input segments of the two-dimensional input network directly connects the input terminals of active devices that are adjacent to each other along rows or columns of the array of the active devices.

8. An amplifier as claimed in claim 1, wherein the input segments of the two-dimensional input network comprise compensating impedance elements between the adjacent active devices.

9. An amplifier as claimed in claim 8, wherein impedances of each one of the compensating impedance elements is selected so that substantially the same voltage is presented to each one of the input terminals of each one of the active devices.

10. An amplifier as claimed in claim 1, wherein the active devices amplify voltages presented at respective input terminals by substantially the same amount.

11. An amplifier as claimed in claim 1, wherein the input segments of the input network are positioned at substantially right angles to each other.

12. An amplifier as claimed in claim 1, wherein the output segments of the output network are positioned at substantially right angles to each other.

13. An amplifier as claimed in claim 1, wherein the input segments of the input network extend one of parallel and perpendicular to each other.

14. An amplifier as claimed in claim 1, wherein the output segments of output network extend one of parallel and perpendicular to each other.

15. A multi-dimensional distributed amplifier, comprising:

a multi-dimensional array of active devices;

a multi-dimensional input network for presenting an input signal at progressively increasing delays to increasing numbers of the active devices; and a multi-dimensional output network being matched in delay to the input network for collecting contributions of the active devices to an amplified signal.

16. An amplifier as claimed in claim 15, wherein the multi-dimensional input network connects input terminals of active devices that are adjacent to each other along rows and columns of the array of the active devices.

17. An amplifier as claimed in claim 15, wherein the multi-dimensional input network comprises compensating impedance elements between the active devices.

18. An amplifier as claimed in claim 17, wherein impedances of the compensating impedance elements is selected so that substantially the same voltage is presented to each input terminal of each one of the active devices.

19. An amplifier as claimed in claim 15, wherein the active devices amplify voltages presented at respective input terminals by substantially the same amount.

20. An amplifier as claimed in claim 15, wherein the input network presents the input signal at progressively increasing delays to decreasing numbers of the active devices, after presenting the input signal to the increasing numbers of active devices.

21. A distributed power amplifier, comprising:

an input network in the form of a grid;

an output network in the form of grid, overlapping the input line; and a plurality of active devices connected between the input line and the output line.

22. An amplifier as claimed in claim 21, wherein input terminals of the active devices are connected to grid line intersections of the input network.

23. An amplifier as claimed in claim 21, wherein output terminals of the active devices are connected to grid line intersections of the output network.

24. An amplifier as claimed in claim 21, wherein the grid of the input network comprises input transmission line segments positioned at substantially right angles to each other.

25. An amplifier as claimed in claim 21, wherein the grid of the output network comprises output transmission line segments positioned at substantially right angles to each other.

26. An amplifier as claimed in claim 21, wherein the grid of the input network comprises input transmission line segments extending parallel to each other.

27. An amplifier as claimed in claim 21, wherein the grid of the input network comprises input transmission line segments that extend one of parallel and perpendicular to each other.

28. An amplifier as claimed in claim 21, wherein the grid of the output network comprises output transmission line segments extending parallel to each other.

29. An amplifier as claimed in claim 21, wherein the grid of the output network comprises output transmission line segments that extend one of parallel and perpendicular to each other.

30. A method for power amplifying an input signal, comprising amplifying the input signal with a plurality of active devices in a two dimensional array as the input signal propagates in two dimensions across a two dimensional input network including a grid of interconnected segments connecting input terminals of the active devices;

progressively collecting an amplified signal generated by the active devices in a two dimensional output line connecting the output terminals of the active devices, the two dimensional output line being matched in delay to the input line so that the contributions to the amplified signal by the active device additively combine with each other.

31. A distributed broadband amplifier, comprising:

a first two-dimensional array of active devices;

a first two-dimensional input network including a grid of interconnected conducting input segments enabling input signals to propagate between input terminals of the active devices of the first array;

a first two-dimensional output network including a grid of interconnected conducting output segments for collecting output signals generated at output terminals of the active devices of the first array;

a second two-dimensional array of active devices;

a second two-dimensional input network including a grid of interconnected conducting input segments enabling the output signals generated by the first array to propagate between input terminals of the active devices of the second array; and a second two-dimensional output network including a grid of interconnected conducting output segments for collecting output signals generated at output terminals of the active devices of the second array.

32. An amplifier as claimed in claim 31, wherein the first array contains fewer active devices than the second array.

33. An amplifier as claimed in claim 31, wherein the output segments of the first and second two-dimensional output networks radiate in two dimensions from the output terminals of the active devices to interconnect the output terminals of the active devices in two dimensions.

34. An amplifier as claimed in claim 31, wherein the input signals to each of the first and second arrays propagate in two dimensions across the first and second input networks.

* * * * *